US007260009B2

United States Patent
Origasa

(10) Patent No.: US 7,260,009 B2
(45) Date of Patent: Aug. 21, 2007

(54) SEMICONDUCTOR INTEGRATED CIRCUIT

(75) Inventor: Kenichi Origasa, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 163 days.

(21) Appl. No.: 11/224,034

(22) Filed: Sep. 13, 2005

(65) Prior Publication Data

US 2006/0056257 A1    Mar. 16, 2006

(30) Foreign Application Priority Data

Sep. 14, 2004    (JP) .............................. 2004-266480

(51) Int. Cl.
*G11C 7/00*    (2006.01)
(52) U.S. Cl. .................. 365/222; 365/189.07
(58) Field of Classification Search ................ 365/222, 365/189.07
See application file for complete search history.

(56) References Cited

U.S. PATENT DOCUMENTS 6,762,967 B2 *    7/2004  Tanizaki et al. ............ 365/201
6,856,566 B2 *    2/2005  Takahashi et al. .......... 365/222
7,200,711 B2 *    4/2007  Valin et al. ................. 711/106

FOREIGN PATENT DOCUMENTS

JP    2003157698    5/2003

* cited by examiner

*Primary Examiner*—Amir Zarabian
*Assistant Examiner*—Kretelia Graham
(74) *Attorney, Agent, or Firm*—Stevens, Davis, Miller & Mosher, LLP

(57) ABSTRACT

A semiconductor integrated circuit includes a logic circuit and a plurality of semiconductor memory devices formed on a semiconductor substrate, and a refresh control circuit for controlling the semiconductor device. The refresh control circuit controls a refresh control signal and a clock signal input to a plurality of memories in a concentrated manner, allowing an reduction in circuit area and the disintegration of operation timings of respective memories.

15 Claims, 27 Drawing Sheets

SEMICONDUCTOR INTEGRATED CIRCUIT

BACKGROUND OF THE INVENTION

1. Field of the Invention

The present invention relates to a semiconductor integrated circuit that is best suited in mounting a plurality of memory devices that require a refresh operation, for example Dynamic Random Access Memories (DRAMs) among memory devices in a System on Chip (SOC) of the semiconductor integrated circuit.

2. Description of the Related Art

FIG. 25 shows a conventional semiconductor integrated circuit. In FIG. 25, reference numerals 100 and 3001 represent a logic circuit and a DRAM, respectively. The logic circuit 100 controls a read/write operation and a refresh operation to the DRAM 3001. Symbol SLEEP represents a self-refresh control signal; NCEn, a read/write enable signal; CLK, a clock signal; and NREFn, a refresh enable signal.

The conventional semiconductor integrated circuit has a mode to perform the refresh operation even when the logic circuit 100 does not apply a cyclic signal to the clock signal CLK. In other words, the semiconductor integrated circuit includes a refresh timer within the DRAM 3001 which has the mode to perform the refresh operation by internally generating a clock signal corresponding to the clock signal CLK (for example, Patent Document 1).

FIG. 26 shows an internal circuit of the DRAM 3001 mounted on the conventional semiconductor integrated circuit. In FIG. 26, reference numeral 3101 represents a command decoder. Various control signals for the DRAM 3001 are inputted to the command decoder 3101, so that the command decoder 3101 recognizes an operation mode and outputs a predetermined signal.

FIG. 27 shows an example of the command decoder 3101. In FIG. 27, reference numerals 3201 and 3202 represent a refresh timer, and a selector, respectively and symbol iSCLK represents a self-refresh clock signal. The command decoder 3101 generates a cyclic clock as the self-refresh clock signal iSCLK when the self-refresh control signal SLEEP, which is connected to the refresh timer 3201, is at H level. The selector 3202 selects the self-refresh clock signal iSCLK instead of the clock signal CLK when the self-refresh control signal SLEEP is at H level. Thus, the DRAM 3001 performs the clock operation regardless of whether or not the clock signal CLK is provided.

Patent Document 1: Japanese Patent Application No. 2001-351826 (Japanese Unexamined Patent Publication (Kokai) No. 2003-157698)

Since a plurality of DRAMs are arranged in the conventional semiconductor integrated circuit, the circuit includes a plurality of refresh timers each mounted in the DRAM. Typically, the refresh timer is required to generate the refresh clock with a relatively long period for an operation clock to reduce power consumption. A RC delay circuit composed of a resistance and a capacitance is therefore used in many cases. In this case, an increase in circuit area will often cause a problem. Another problem is that, when the plurality of DRAMs perform the refresh operation at once, the plurality of DRAMs may simultaneously operate depending on the timing to increase a peak current, so that malfunction may occur due to a voltage drop.

SUMMARY OF THE INVENTION

It is an object of the present invention to provide, in such a system LSI in which a plurality of memories are arranged, a semiconductor integrated circuit allowing to perform a refresh operation using a refresh timer without an increase in circuit area.

It is another object of the present invention to provide the semiconductor integrated circuit allowing to prevent an increase in peak current even when simultaneous refresh operation is performed to a plurality of DRAMs to thereby avoid a malfunction caused by a voltage drop.

In order to achieve the objects, the semiconductor integrated circuit according to a first aspect of the present invention includes a logic circuit and a plurality of semiconductor memory devices formed on a semiconductor substrate, and a refresh control circuit for controlling the plurality of semiconductor memory devices. The plurality of semiconductor memory devices are clock synchronous and includes a clock input and a refresh function for refreshing data in a memory cell arranged therein. The logic circuit outputs a sleep control signal and a first clock signal. The refresh control circuit receives the sleep control signal and the first clock signal outputted from the logic circuit, and outputs a second clock signal to clock inputs of the plurality of semiconductor memory devices. The refresh control circuit, when the sleep control signal is in a first state, outputs the first clock signal as the second clock signal to enable the control of the plurality of semiconductor memory devices by the logic circuit. Additionally, the refresh control circuit, when the sleep control signal is in a second state, outputs a clock signal having a clock cycle different from that of the first clock signal as the second clock signal.

According to the semiconductor integrated circuit in the first aspect of the present invention, the refresh control circuit receives the sleep control signal and the first clock signal outputted from the logic circuit, and outputs the second clock signal to the clock inputs of the plurality of semiconductor memory devices. The refresh control circuit, when the sleep control signal is in the first state, outputs the first clock signal as the second clock signal to enable the control of the plurality of semiconductor memory devices by the logic circuit. Additionally, the refresh control circuit, when the sleep control signal is in the second state, outputs the clock signal having the clock cycle different from that of the first clock signal as the second clock signal. The respective semiconductor memory devices can therefore be set to a refresh condition without including a plurality of clock generators in the respective DRAMs.

According to a second aspect of the present invention, the semiconductor integrated circuit according to the first aspect of the present invention is provided, wherein the plurality of semiconductor memory devices include a refresh control terminal. The logic circuit outputs a first refresh control signal. The refresh control circuit receives the first refresh control signal and outputs a second refresh control signal to the refresh control terminal. The refresh control circuit, when the sleep control signal is in the first state, outputs the first refresh control signal as the second refresh control signal. Additionally, the refresh control circuit, when the sleep control signal is in the second state, outputs a predetermined electric potential as the second refresh control signal and the plurality of semiconductor memory devices are set to the refresh condition.

According to the semiconductor integrated circuit in the second aspect of the present invention, the refresh control circuit receives the sleep control signal, the first clock signal, and the first refresh control signal outputted from the logic circuit, and outputs the second clock signal to the clock inputs of the plurality of semiconductor memory devices and the second refresh control signal to the refresh control terminal, respectively. The refresh control circuit, when the sleep control signal is in the first state, outputs the first clock signal as the second clock signal and the first refresh control signal as the second refresh control signal, respectively, to enable the control of the plurality of semiconductor memory devices by the logic circuit. Additionally, the refresh control circuit, when the sleep control signal is in the second state, outputs the clock signal having the clock cycle different from that of the first clock signal as the second clock signal and the predetermined electric potential as the second refresh control signal, respectively, to set the plurality of the semiconductor memory devices to the refresh condition. The refresh operation can therefore be performed automatically for the plurality of DRAMs and thus hold data by the simple control only by setting a self-refresh control signal (sleep control signal) to H level by means of the logic circuit mounted thereon. Moreover, without preparing the refresh timer having the relatively large area in the respective DRAMs, the overall area can be significantly reduced.

According to a third aspect of the present invention, the semiconductor integrated circuit according to the second aspect of the present invention is provided, wherein the plurality of semiconductor memory devices each includes a plurality of memory cells, a plurality of word lines and a plurality of bit lines connected to the plurality of memory cells, a column decoder connected to the plurality of bit lines having a function to amplify data in the plurality of memory cells, a row decoder for driving the plurality of word lines, a first selector for outputting a first address signal inputted to the row decoder and receiving inputs of a second address signal and a third address signal, an address latch circuit for outputting the second address signal and receiving an external address signal, a refresh address counter for outputting the third address signal, and an internal refresh selection signal for controlling the first selector. The internal refresh selection signal is controlled by the second refresh control signal, the first selector selects the second address signal as the first address signal when the internal refresh selection signal is in a first state, and the first selector selects the third address signal as the first address signal when the internal refresh selection signal is in a second state.

According to the third aspect of the present invention, the semiconductor integrated circuit in the second aspect of the present invention can achieve the internal configuration of the DRAM.

According to a fourth aspect of the present invention, the semiconductor integrated circuit according to the first aspect of the present invention is provided, wherein the refresh control circuit includes a first clock generating device for outputting a third clock signal when the sleep control signal is at the predetermined electric potential, and a second selector for receiving the first clock signal and the third clock signal and outputting the second clock signal. The second selector is controlled by the sleep control signal, the second selector outputs the first clock signal as the second clock signal when the sleep control signal is in the first state, and the second selector outputs the third clock signal as the second clock signal when the sleep control signal is in the second state.

According to the fourth aspect of the present invention, the semiconductor integrated circuit in the first aspect of the present invention can achieve the basic configuration provided with the clock generating device and the selector of the refresh control circuit.

According to a fifth aspect of the present invention, the semiconductor integrated circuit according to the fourth aspect of the present invention is provided, wherein the first clock generating device includes a ring oscillator, a first frequency divider to divide the output of the ring oscillator in a predetermined cycle, and a third selector to select either of the output from the ring oscillator or the output from the first frequency divider, wherein the output of the third selector is the third clock signal.

According to the fifth aspect of the present invention, the semiconductor integrated circuit in the fourth aspect of the present invention can readily alter the charge retention current of the respective DRAMs by including the frequency division operation of the oscillator output signal in the refresh timer (clock generating device). The respective semiconductor memory devices can therefore be set to the refresh condition without including the plurality of clock generators in the respective DRAMs. Moreover, a refresh cycle can be readily changed by, for example, a single fuse disconnection, or the control from the logic circuit.

According to a sixth aspect of the present invention, the semiconductor integrated circuit according to the fifth invention is provided, wherein the refresh control circuit includes fuse means and a fuse detection circuit for detecting a disconnection condition of the fuse means, wherein the third selector selects either of the output from the ring oscillator or the output from the first frequency divider in response to the signal outputted from the fuse detection circuit.

According to the sixth aspect of the present invention, the frequency divider of the semiconductor integrated circuit in the fifth aspect of the present invention can be controlled by the fuse means.

According to a seventh aspect of the present invention, the third selector of the semiconductor integrated circuit according to the fifth aspect of the present invention is provided, wherein the third selector is controlled by the logic circuit.

According to the seventh aspect of the present invention, the frequency divider of the semiconductor integrated circuit in the fifth aspect of the present invention can be controlled by the logic circuit.

According to an eighth aspect of the present invention, the semiconductor integrated circuit according to the first aspect of the present invention is provided, wherein a plurality of second clock signals are outputted from the refresh control circuit to the plurality of semiconductor memory devices. The refresh control circuit includes a second clock generating device for outputting a fourth clock signal when the sleep control signal is at the predetermined electric potential, a fourth selector for receiving the first clock signal and the fourth clock signal and outputting one of the second clock signals, one or more delay means for delaying the second clock signal by a predetermined time, and one or more fifth selectors for selecting either of the output from the one or more delay means or the output from the fourth selector. The output from the fifth selector is the second clock signal, the fourth selector is controlled by the sleep control signal, the fourth selector outputs the first clock signal as one of the second clock signals when the sleep control signal is in the first state, and the fourth selector outputs the fourth clock signal as one of the second clock signals when the sleep control signal is in the second state. Additionally, the fifth selector is controlled by the sleep control signal, the fifth selector outputs the first clock signal as the second clock signal when the sleep control signal is in the first state, and the fifth selector outputs the outputs from the one or more delay means as the rest of the second clock signals when the sleep control signal is in the second state.

According to the eighth aspect of the present invention, the semiconductor integrated circuit in the first aspect of the present invention applies the clock signal for the refresh operation to the plurality of DRAMs at different timings. For that reason, the time difference is generated between the refresh operations of the DRAMs, allowing the stable refresh operation achieved by suppressing a peak current. The respective semiconductor memory devices can therefore be set to the refresh condition without including the plurality of clock generators in the respective DRAMs. Furthermore, an increase in peak current can be suppressed by the refresh operations of the plurality of semiconductor memory devices to be delayed respectively by means of the delay element.

According to a ninth aspect of the present invention, the semiconductor integrated circuit according to the eighth aspect of the present invention is provided, wherein a second frequency divider is prepared for a predetermined output among the outputs from the plurality of delay means, and the output from the second frequency divider is inputted to the fifth selector.

According to the ninth aspect of the present invention, it is useful for the semiconductor integrated circuit in the eighth aspect of the present invention when the different refresh cycles are applied by means of the delay element and the frequency divider.

According to a tenth aspect of the present invention, the semiconductor integrated circuit according to the eighth aspect of the present invention is provided, wherein the fifth selector is controlled by the sleep control signal and the first refresh control signal.

According to the tenth aspect of the present invention, the semiconductor integrated circuit in the eighth aspect of the present invention can achieve the delay during the refresh operation either by the sleep control signal and the first refresh control signal.

According to an eleventh aspect of the present invention, the semiconductor integrated circuit according to the ninth aspect of the present invention is provided, wherein the second frequency divider has a function for outputting the output from the plurality of delay means as it is without dividing the output frequency when the sleep control signal is in the first state, and the fifth selector is controlled by the first refresh control signal.

According to the eleventh aspect of the present invention, the semiconductor integrated circuit in the ninth aspect of the present invention can be configured not to use the frequency divider when the fifth selector is controlled by the first refresh control signal.

According to a twelfth aspect of the present invention, the semiconductor integrated circuit according to the first aspect of the present invention is provided, wherein the plurality of second clock signals outputted from the refresh control circuit to the plurality of semiconductor memory devices are prepared. The refresh control circuit includes a third clock generating device for outputting a fifth clock signal when the sleep control signal is at the predetermined electric potential, a sixth selector for receiving the first clock signal and the fifth clock signal, and a clock sequence control circuit for selectively outputting the fifth clock signal outputted from the sixth selector as the plurality of the second clock signals. The clock sequence control circuit changes a selection condition for selecting the plurality of second clock signals that output the fifth clock signal in synchronization with the fifth clock signal.

According to the twelfth aspect of the present invention, the respective semiconductor memory devices of the semiconductor integrated circuit in the first aspect of the present invention can be set to the refresh condition without including the plurality of clock generators in the respective DRAMs. Moreover, the refresh operations of the plurality of semiconductor memory devices are performed sequentially, allowing an increase in peak current to be further suppressed.

According to a thirteenth aspect of the present invention, the semiconductor integrated circuit according to the twelfth aspect of the present invention is provided, wherein the selection condition of the clock sequence control circuit is set to a predetermined condition at a rising edge of the sleep control signal.

According to the thirteenth aspect of the present invention, the semiconductor integrated circuit in the twelfth aspect of the present invention can perform a reset operation by means of the sleep control signal.

According to a fourteenth aspect of the present invention, the semiconductor integrated circuit according to the twelfth aspect of the present invention is provided, wherein the selection condition of the clock sequence control circuit is controlled by a signal different from the sleep control signal outputted from the logic circuit.

According to the fourteenth aspect of the present invention, the semiconductor integrated circuit in the twelfth aspect of the present invention can perform the reset operation by means of the signal outputted from the logic circuit.

According to a fifteenth aspect of the present invention, the semiconductor integrated circuit according to the twelfth aspect of the present invention is provided, wherein the selection condition of the clock sequence control circuit is set only once after a predetermined period from the start-up of a power source has elapsed.

According to the fifteenth aspect of the present invention, the semiconductor integrated circuit in the twelfth aspect of the present invention can perform the reset operation at the start-up of the power source.

DETAILED DESCRIPTION OF THE PREFERRED EMBODIMENTS

Hereinafter, embodiments of the present invention will be described with reference to the drawings.

Figure 1:
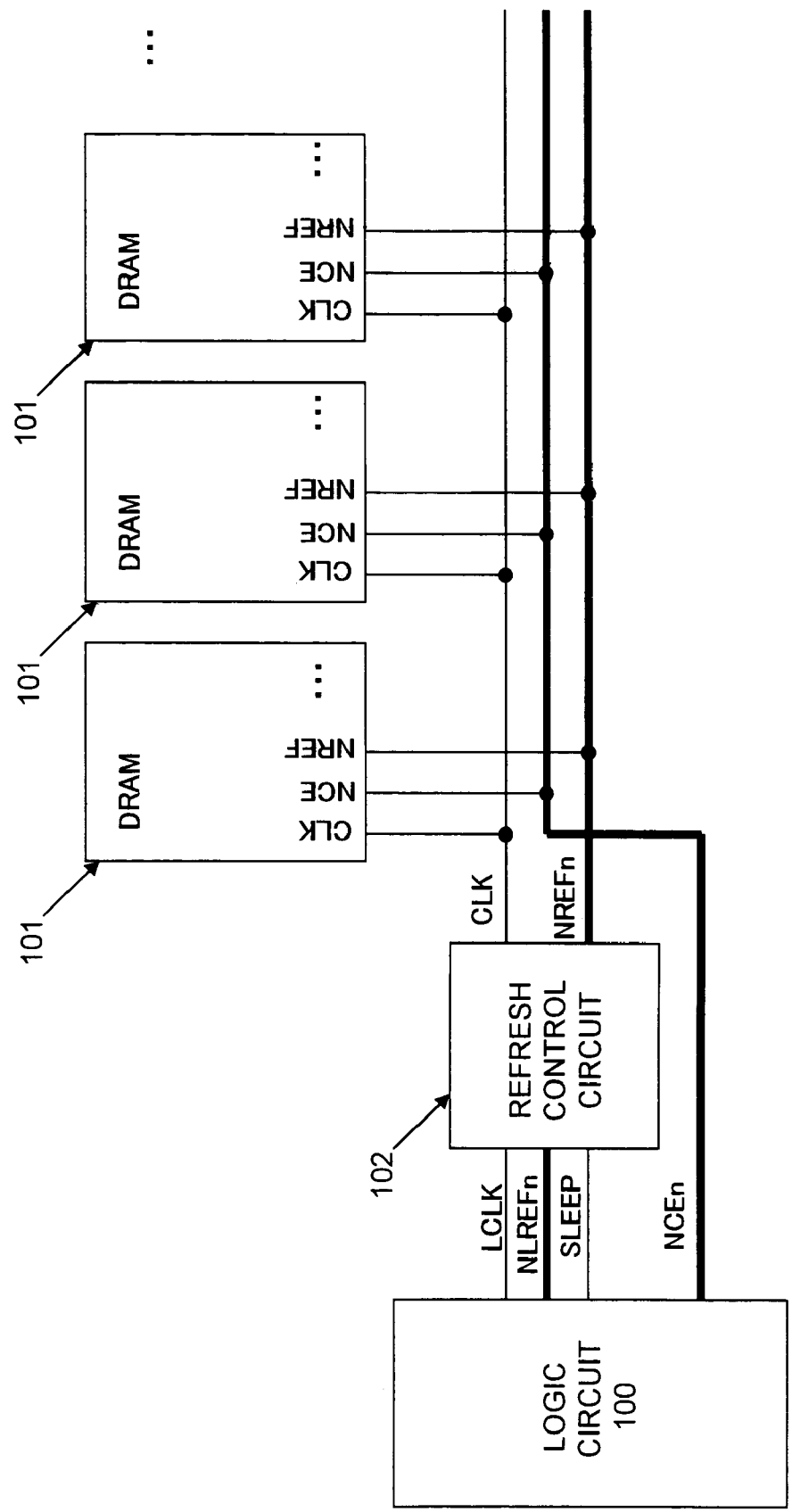
FIG. 1 is a block diagram of a semiconductor memory device and its control circuit on a System on Chip (SOC) of a semiconductor integrated circuit according to a first embodiment of the present invention.

FIG. 1 shows a block diagram of a semiconductor memory device and its control circuit on a System on Chip (SOC) of a semiconductor integrated circuit according to a first embodiment of the present invention.

In FIG. 1, reference numeral 100 represents a logic circuit, 101 represents a DRAM, 102 represents a refresh control circuit, LCLK represents a clock from the logic circuit (first clock signal), NLREFn represents a refresh enable signal inputted from the logic circuit (first refresh control signal), SLEEP represents a self-refresh control signal (sleep control signal), NCEn represents a read/write enable signal, CLK represents a clock signal (second clock signal), and NREFn represents a refresh enable signal (second refresh control signal).

The plurality of DRAMs 101 are arranged on the semiconductor integrated circuit. The clock input signal CLK, the read/write enable signal NCEn (n=0, 1, 2 . . . ), the refresh enable signal input NREFn (n =0, 1, 2 . . . ) are connected to the DRAM 101. The common clock signal CLK outputted from the refresh control circuit 102 is inputted to the plurality of DRAMs 101. The read/write enable signal NCEn is generally controlled by a functional block, such as a microcomputer, on the semiconductor integrated circuit. Moreover, the refresh enable signal input NREFn is outputted from the refresh control circuit 102.

Figure 2:
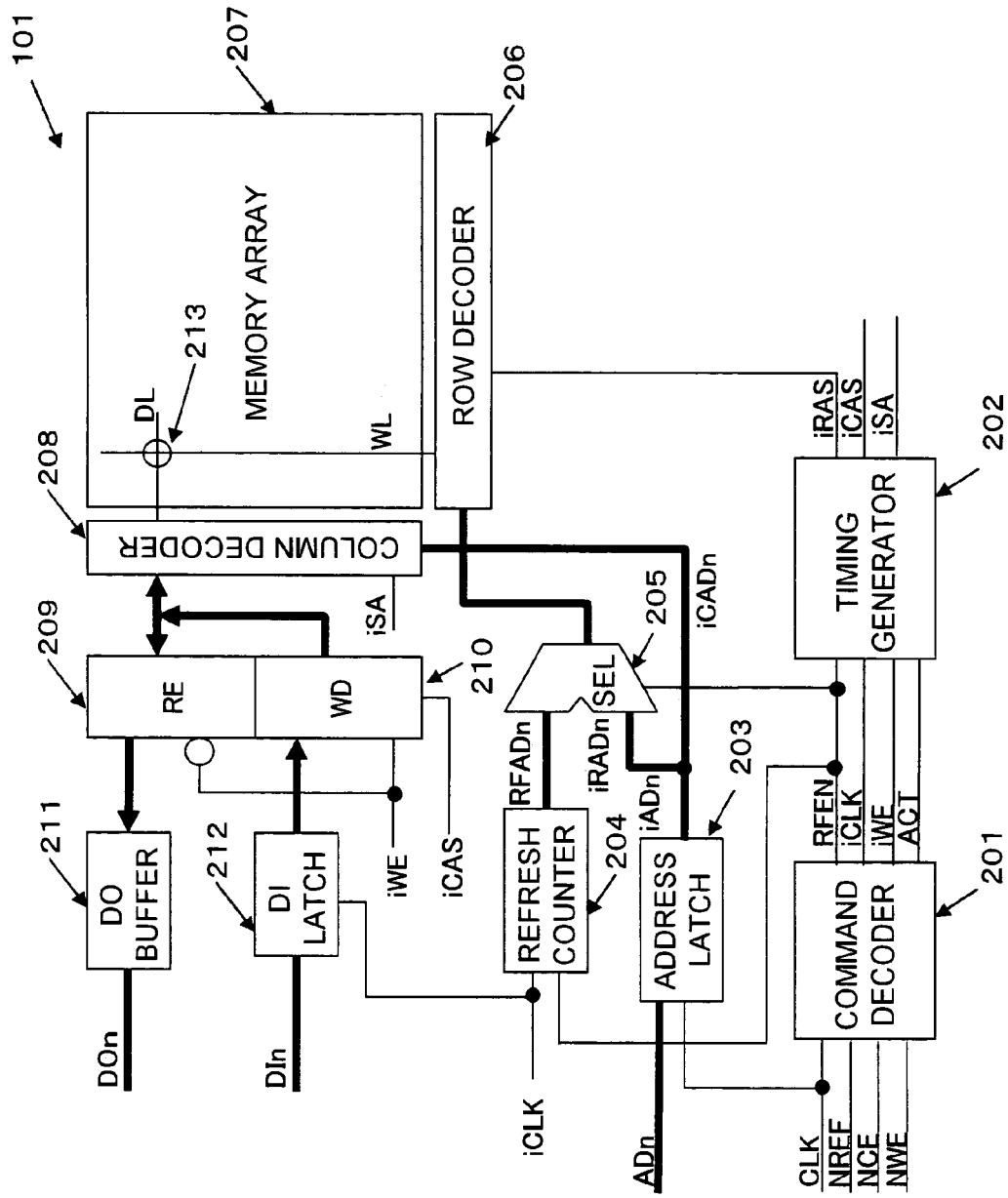
FIG. 2 is a block diagram of a DRAM 101.

FIG. 2 shows a block diagram of the DRAM 101.

In FIG. 2, symbol NWE represents a write enable signal, ADn represents an address signal, DOn represents a data output signal, DIn represents a data input signal, 201 represents a command decoder, 202 represents a timing generator, 203 represents an address latch, 204 represents a refresh counter, 205 represents a selector (first selector), 206 represents a row decoder, 207 represents a memory array, 208 represents a column decoder, 209 represents a read amplifier, 210 represents a write driver, 211 represents a DO buffer, and 212 represents a DI latch. Symbol RFEN represents a internal refresh enable signal (internal refresh selection signal), iCLK represents an internal clock, iWE represents an internal write enable signal, iADn represents an internal address signal, iRAS represents an internal row address strobe signal, iCAS represents an internal column address strobe signal, iSA represents a sense amplifier starting signal, RFADn represents a refresh address signal (third address signal), iRADn represents a row address signal (second address signal), iCADn represents a column address signal, DL represents a data line, WL represents a word line, 213 represents a memory cell, and ACT represents an active flag.

The clock signal CLK, the refresh enable signal input NREF, the read/write enable signal NCE, and the write enable signal NWE are inputted to the command decoder 201. The command decoder outputs the internal refresh enable signal RFEN, the internal clock iCLK, the internal write enable signal iWE, and the active flag ACT.

Upon reception of the internal refresh enable signal RFEN, the internal clock iCLK, and the internal write enable signal iWE, the timing generator 202 outputs the internal row address strobe signal iRAS, the internal column address strobe signal iCAS, and the sense amplifier starting signal iSA.

The address signal ADn and the clock signal CLK are inputted to the address latch 203 which in turn outputs the internal address signal iADn. Among the internal address signals iADn, the address uniquely indicating a specific word line WL is the row address signal iRADn and the address uniquely indicating a specific data line DL is the column address signal iCADn.

The internal clock iCLK and the internal refresh enable signal RFEN are inputted to the refresh counter 204 which in turn outputs the refresh address signal RFADn. The row address signal iRADn, the refresh address signal RFADn, and further the internal refresh enable signal RFEN are inputted to the selector 205, and the output thereof is connected to the row decoder 206.

The internal row address strobe signal iRAS is inputted to the row decoder 206, configured by a plurality of word drivers electrically driving the plurality of word lines WL and control circuit thereof, to drive the specific word line WL. The memory cell 213 is arranged at each intersection of the plurality of word lines WL and the plurality of data lines DL. The plurality of data lines DL are connected to the column decoder 208, the column address signal iCADn is inputted to the column decoder 208, and the read amplifier 209 and the write driver 210 are connected thereto.

The column decoder 208 is configured by the sense amplifier which amplifies data from the data line DL. The output from the read amplifier 209 is inputted to the DO buffer 211. The DO buffer 211 outputs the data output signal DOn. The data input signal DIn is inputted to the DI latch 212 and the output therefrom is inputted to the write driver 210.

Figure 3:
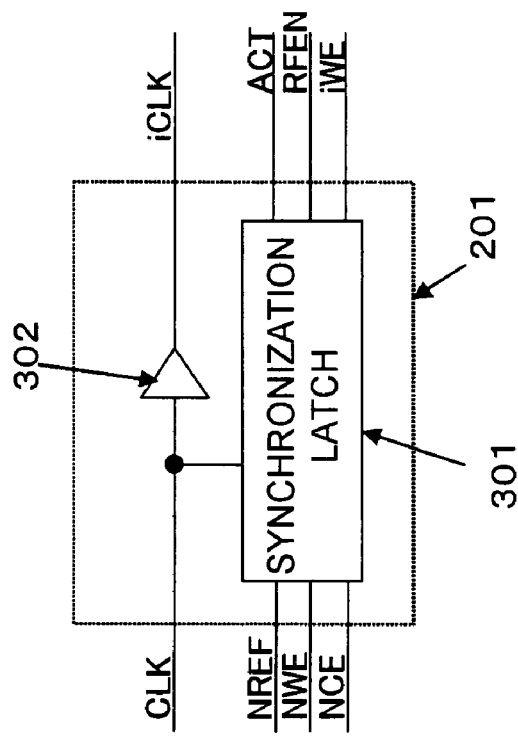
FIG. 3 is a block diagram of a command decoder 201.

FIG. 3 is a block diagram of the command decoder 201. In FIG. 3, reference numeral 301 represents a synchronization latch and 302 represents a buffer.

The clock signal CLK is inputted to the synchronization latch 301 as the clock input. The synchronization latch 301 latches the refresh enable signal input NREF, the read/write enable signal NCE and the write enable signal NWE each input thereto in synchronization with a rising edge of the clock signal CLK, and outputs the internal refresh enable signal RFEN, the internal write enable signal iWE and the active flag ACT corresponding to the inputs respectively. The clock signal CLK is inputted to the buffer 302 which in turn outputs the internal clock iCLK. Unlike the conventional DRAM, the DRAM 101 does not hold a refresh timer therein.

Figure 4:
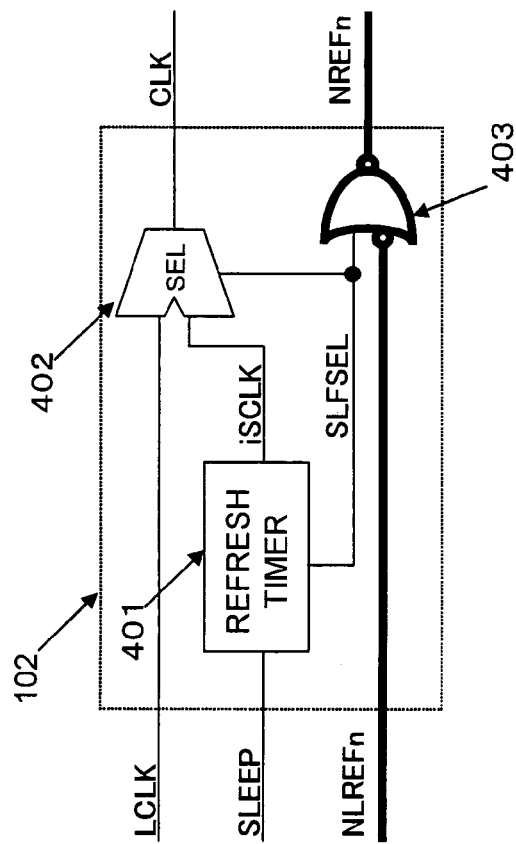
FIG. 4 is a block diagram of a refresh control circuit 102.

FIG. 4 shows a block diagram of the refresh control circuit 102. In FIG. 4, reference numeral 401 represents a refresh timer (first clock generating device), 402 represents a selector (second selector), 403 represents an NOR circuit, iSCLK represents a self-refresh clock (third clock signal), and SLFSEL represents a self-refresh selection signal.

The self-refresh control signal SLEEP is inputted to the refresh timer 401 which in turn outputs the self-refresh clock iSCLK and the self refresh selection signal SLFSEL. The clock from the logic circuit LCLK and the self-refresh clock iSCLK are inputted to the selector 402, and either of the inputs is selected by the selector 402 in response to the self-refresh selection signal SLFSEL. The refresh enable signal inputted from the logic circuit NLREFn and the self-refresh selection signal SLFSEL are inputted to the NOR circuit 403.

Figure 5:
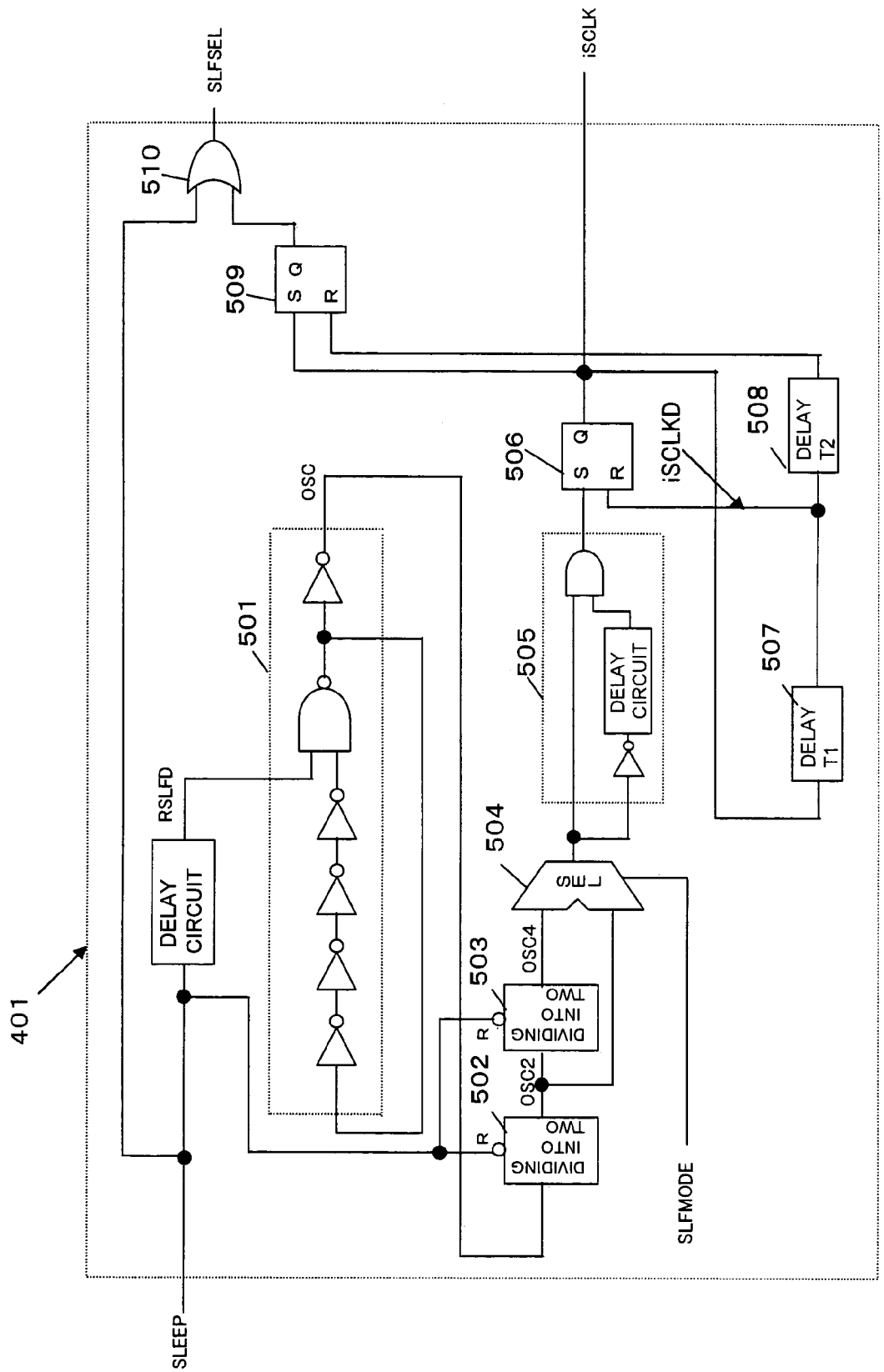
FIG. 5 is a circuit diagram of a refresh timer 401.

FIG. 5 is a circuit diagram of the refresh timer 401. In FIG. 5, reference numeral 501 represents an oscillator, 502 and 503 represent frequency dividers (first frequency dividers), 504 represents a selector (third selector), 505 represents a one-shot circuit, 506 and 509 represent SR flip-flops, 507 and 508 represent delay circuits, 510 represents an OR circuit, RSLFD represents a ring oscillator enable signal. Symbols OSC, OSC2, and OSC4 represent 1/1, 1/2, and 1/4 frequency dividing signals of the oscillator output, respectively. Symbol SLFMODE represents a self-refresh cycle selection signal.

The self-refresh control signal SLEEP is inputted to the oscillator 501 which in turn outputs the 1/1 frequency dividing signal of the oscillator output OSC. The 1/1 frequency dividing signal of the oscillator output OSC is inputted to the frequency divider 502 which outputs the 1/2 frequency dividing signal of the oscillator output OSC2. Similarly, the 1/2 frequency dividing signal of the oscillator output OSC2 is inputted to the frequency divider 503 which outputs the 1/4 frequency dividing signal of the oscillator output OSC4.

The 1/2 and 1/4 frequency dividing signals of the oscillator output OSC2 and OSC4 are inputted to the selector 504 and selected by the self-refresh cycle selection signal SLFMODE. The output from the selector 504 is inputted to the one-shot circuit 505. The output side of the one-shot circuit 505 is connected to an S input side of the SR flip-flop 506. Input to an R input side of the SR flip-flop 506 is a signal iSCLKD which is the self-refresh clock iSCLK as the output of the SR flip-flop 506 delayed by the delay element 507. Moreover, input to an R input side of the SR flip-flop 509 is a signal which is the iSCLKD delayed further by the delay element 508, while the self-refresh clock iSCLK is inputted to an S input side. The self-refresh control signal SLEEP and the output of the SR flip-flop 509 are inputted to the OR circuit 510.

Figure 6:
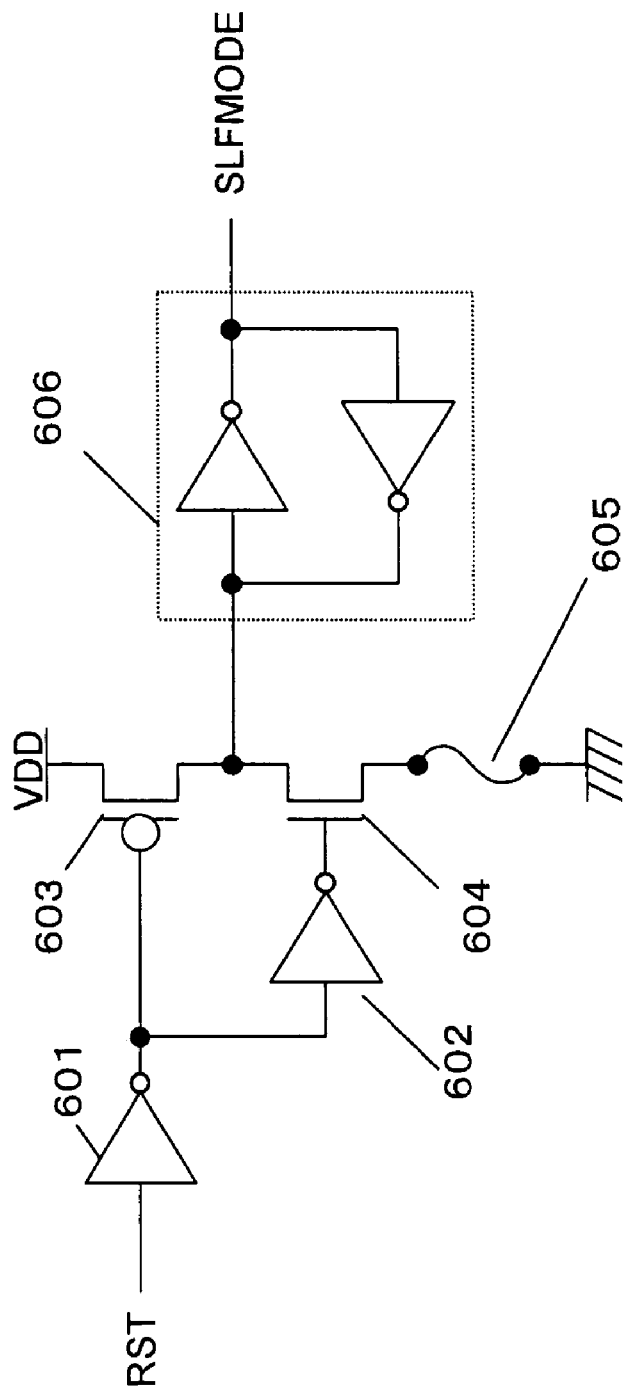
FIG. 6 is a circuit diagram of a setting circuit of a self-refresh cycle selection signal SLFMODE.

FIG. 6 is a setting circuit of the self-refresh cycle selection signal SLFMODE. In FIG. 6, symbol RST represents a system reset signal, VDD represents a chip supply, 601 and 602 represent inverters, 603 represents a Pch transistor, 604 represents a Nch transistor, 605 represents a fuse element, and 606 represents a latch circuit.

The system reset signal RST is inputted to the inverter 601. The output from the inverter 601 is inputted to a gate of the Pch transistor 603 and the inverter 602. Power is supplied to a source of the Pch transistor 603 and a drain thereof is connected to a drain of the Nch transistor 604. The fuse element 605 is connected to a source of the Nch transistor 604 while the other terminal of the fuse element 605 is connected to the ground. The drain of the Nch transistor 604 is connected to an input side of the latch circuit 606 and the output of the latch circuit is set as the self-refresh cycle selection signal SLFMODE. A current capacity of the Pch transistor 603 is set substantially lower than that of the Nch transistor 604.

The operations will be described hereinbelow as to the semiconductor memory device and its control circuit according to the first embodiment of the present invention configured as described above.

Figure 7:
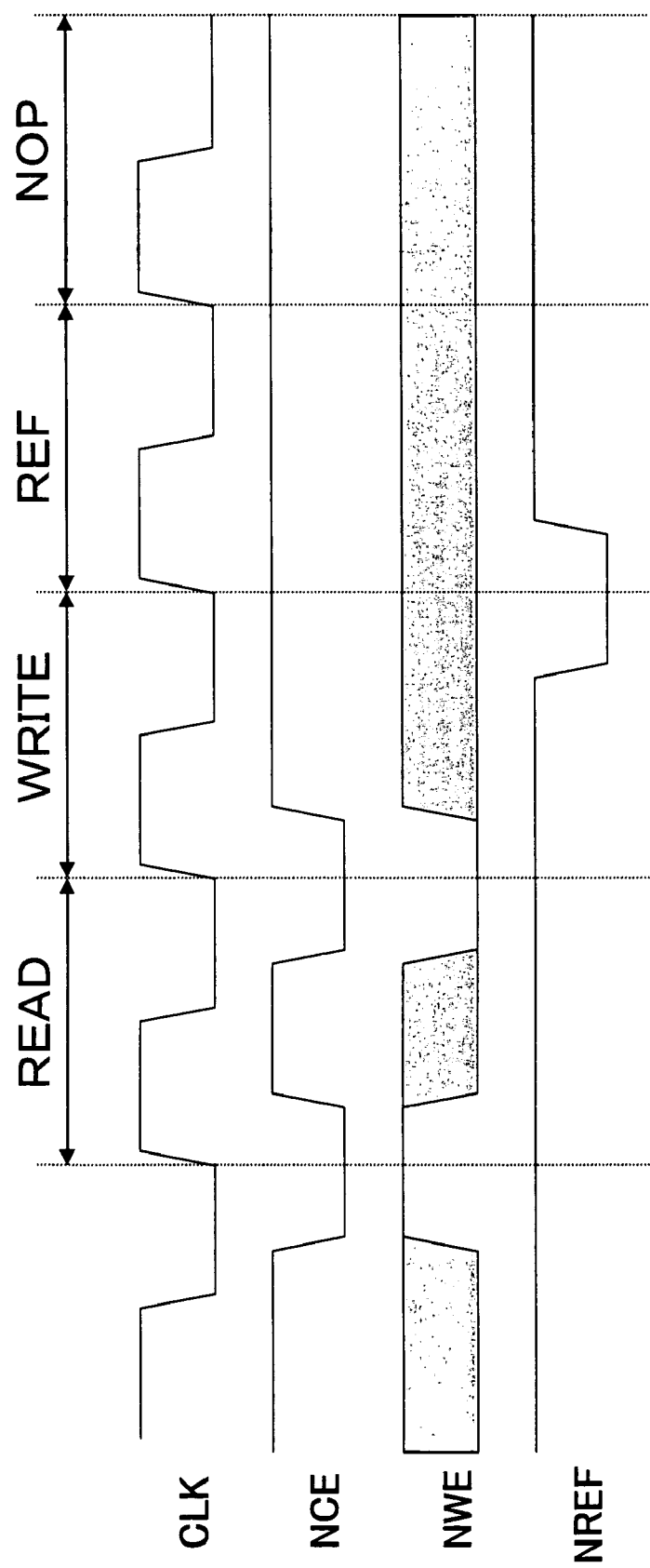
FIG. 7 is a diagram illustrating control commands of the DRAM 101.

FIG. 7 shows control commands of the DRAM 101. The DRAM 101 receives a READ command where the refresh enable signal input NREF attains H level, the read/write enable signal NCE attains L level, and the write enable signal NWE attains H level in synchronization with the rising edge of the clock signal CLK.

Similarly, a WRITE command is received where the refresh enable signal input NREF attains H level, the read/ write enable signal NCE attains L level, and the write enable signal NWE attains L level.

Moreover, a REFRESH command is received where the refresh enable signal input NREF attains L level and the read/write enable signal NCE attains H level.

Furthermore, the operation is not performed where the refresh enable signal input NREF attains H level and the read/write enable signal NCE attains H level.

In the READ command operation, the internal refresh enable signal RFEN is at L level and the selector 205 selects the row address signal iRADn outputted from the address latch 203. The row decoder 206 activates the word line WL corresponding to the row address signal iRADn in response to the internal row address strobe signal iRAS. The column decoder 208 amplifies the data in the memory cell 213 connected to the activated word line WL in response to the sense amplifier starting signal iSA and outputs the data selected by the column address signal iCADn to the read amplifier 209. In the READ command operation, the internal write enable signal iWE is at L level, the read amplifier 209 is activated to output the data from the column decoder 208 to the DO buffer 211. The DO buffer 211 outputs the data to the data output signal DOn.

In the WRITE command operation, the internal refresh enable signal is at L level and the selector 205 selects the row address signal iRADn outputted from the address latch 203. The row decoder 206 activates the word line WL corresponding to the row address signal iRADn in response to the internal row address strobe signal iRAS. The DI latch 212 latches the data of the data input signal DIn in synchronization with the internal clock signal iCLK. The internal write enable signal iWE is at H level and the write driver 210 is activated in the WRITE command operation. The write driver 210 outputs a signal corresponding to the data in the DI latch 212 to the column decoder 208. The column decoder 208 outputs the data to the data line DL in response to the column address signal iCADn and write the data in the memory cell 213 connected to the activated word line WL.

In the REFRESH command operation, the internal refresh enable signal RFEN is at H level and the selector 205 selects the refresh address signal RFADn which is-the output of the refresh counter 204. The row decoder 206 activates the word line WL corresponding to the row address signal iRADn in response to the internal row address strobe signal iRAS. The column decoder 208 amplifies the data in the memory cell 213 connected to the activated word line WL in response to the sense amplifier starting signal iSA. For that reason, the data in the memory cell 213 is refreshed.

The self-refresh operation in the system shown in FIG. 1 including the plurality of DRAMs 101 operating as above will be described with reference to FIG. 8.

Figure 8:
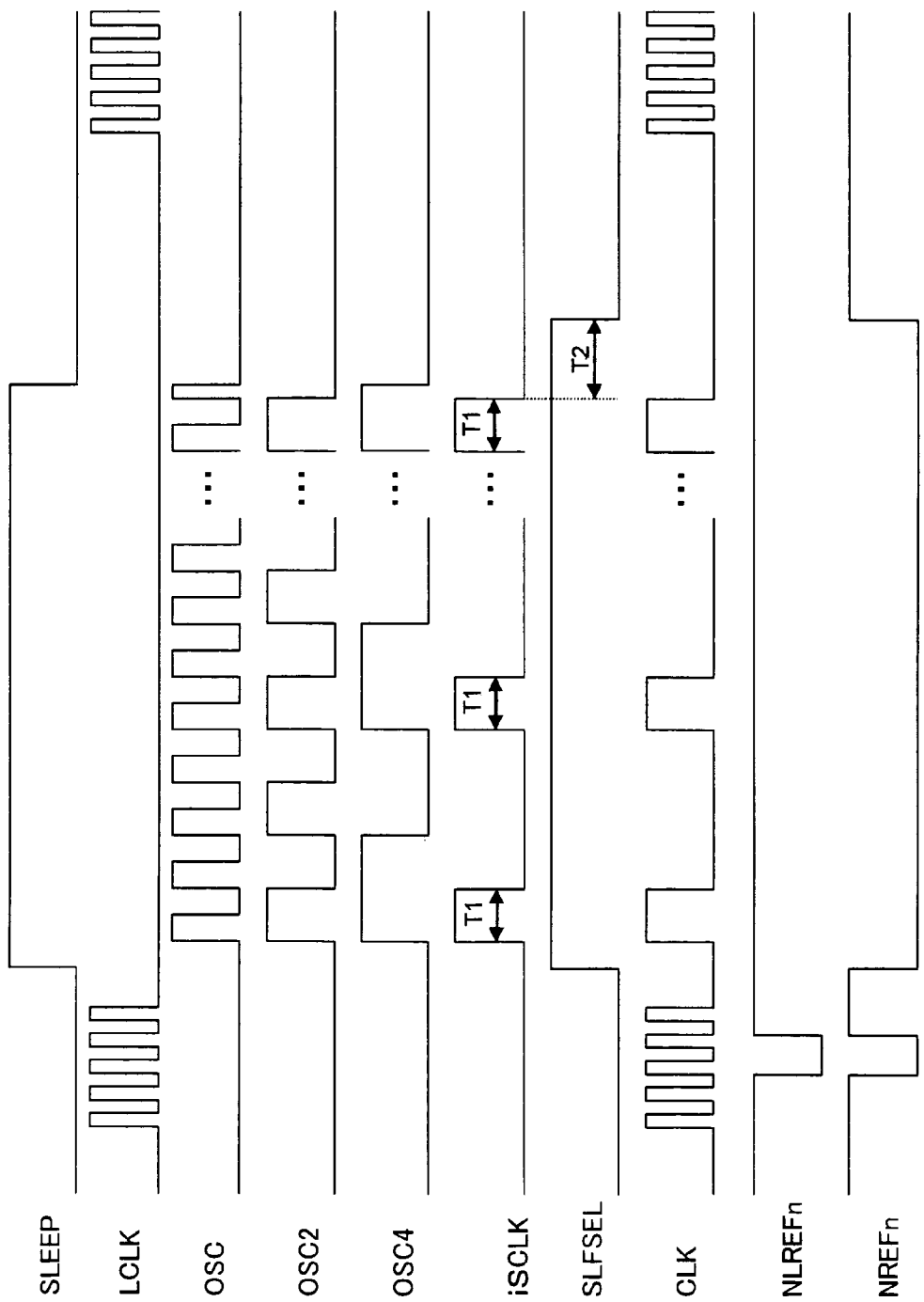
FIG. 8 is a timing waveform chart according to the first embodiment.

FIG. 8 is a timing chart. When the self-refresh control signal SLEEP is at L level, the refresh timer 401 is inactive. Since the frequency dividers 502 and 503 are reset and output L level, the SR flip-flops 506 and 509 output L level, and the self-refresh selection signal SLFSEL is at L level. When the self-refresh selection signal SLFSEL is at L level, the selector 402 selects the clock from the logic circuit LCLK and the clock from the logic circuit LCLK controlled by the logic circuit is applied to the clock signal CLK. When the self-refresh control signal SLEEP is at L level, the signal synchronized with the refresh enable signal inputted from the logic circuit NLREFn is inputted to the refresh enable signal input NREFn.

In this case, any of the READ, WRITE, and REFRESH operations is selected arbitrarily by the mix-loaded logic circuits.

When the self-refresh control signal SLEEP is at H level, the refresh timer 401 is active. The self-refresh selection signal SLFSEL is at H level. The oscillator 501 outputs a cyclic signal as the 1/1 frequency division signal of the oscillator output OSC. The frequency divider 502 outputs the 1/1 frequency dividing signal of the oscillator output OSC divided into frequency by two as the 1/2 frequency dividing signal of the oscillator output OSC2. The frequency divider 503 outputs the 1/1 frequency dividing signal of the oscillator output OSC divided into frequency by four as the 1/4 frequency dividing signal of the oscillator output OSC4.

The selector 504 selects and outputs either of the 1/2 and 1/4 frequency dividing signals of the oscillator output OSC2 and OSC4 in response to the self-refresh cycle selection signal SLFMODE. A positive edge of the clock is extracted by the one-shot circuit 505, and the SR flip-flop 506 is set to output H level. After a delay time T1 of the delay element 507 has elapsed, the SR flip-flop 506 is reset.

The self-refresh clock iSCLK becomes the cyclic signal by this operation. The self-refresh selection signal SLFSEL attains L level when a delay time T2 of the delay element 508 has elapsed from the falling edge of the self-refresh clock iSCLK. The delay time T2 is set substantially longer than the time from the rising edge of the self-refresh clock iSCLK to the end of the refresh operation of the DRAM 101.

When the self-refresh selection signal SLFSEL is at H level, the selector 402 selects the self-refresh clock iSCLK. When the self-refresh control signal SLEEP is at H level, L level is inputted to the refresh enable signal input NREFn.

Additionally, where the fuse element 605 is not disconnected, the drain of the Pch transistor 603 attains L level when the system reset RST is changed from H level to L level, and H level is outputted as the self-refresh cycle selection signal SLFMODE. In this case, the selector 504 selects the 1/4 frequency dividing signal of the oscillator output OSC4. It is selected when the relatively frequent refresh operation is not required, in such a case that the System on Chip loading the semiconductor memory device of the present invention operates at relatively low temperature.

Where the fuse element 605 is disconnected, the drain of the Pch transistor 603 attains H level when the system reset RST is changed from H level to L level, and L level is outputted as the self-refresh cycle selection signal SLFMODE. In this case, the selector selects the 1/2 frequency dividing signal of the oscillator output OSC2. It is selected when the relatively frequent refresh operation is required, in such a case that the System on Chip loading the semiconductor memory device of the present invention operates at relatively high temperature.

Figure 9:
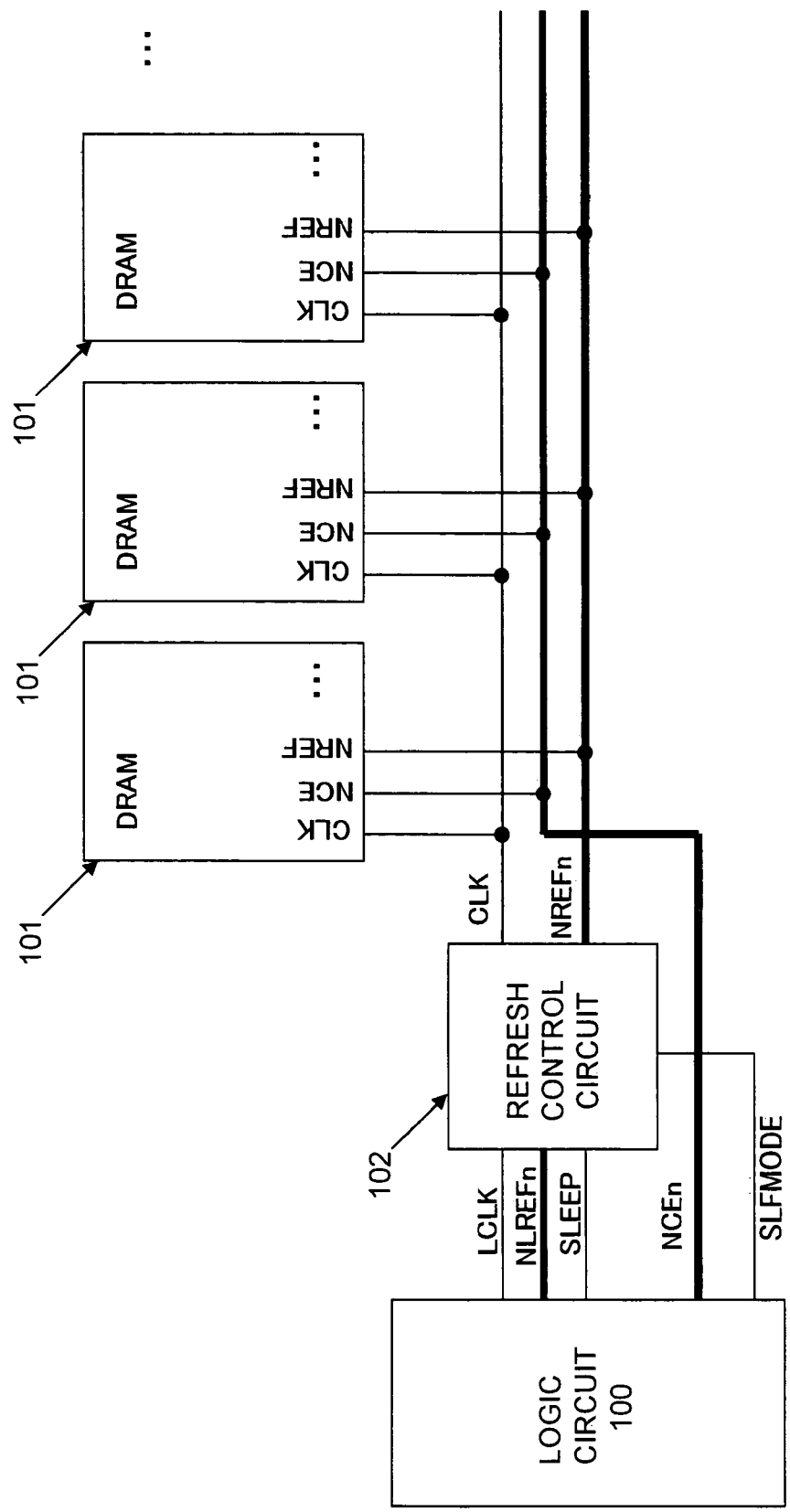
FIG. 9 is a circuit diagram for the case of a logic circuit 100 controlling the self-refresh cycle selection signal SLFMODE.

FIG. 9 is a circuit diagram for the case of the logic circuit 100 controlling the self-refresh cycle selection signal SLFMODE. In this case, the self-refresh cycle selection signal SLFMODE is outputted from the logic circuit 100 which can then control the refresh cycle.

According to the foregoing operations, the semiconductor integrated circuit according to the embodiment of the present invention can perform the refresh operation automatically for the plurality of DRAMs 101 and thus hold the data by the simple control only by setting the self-refresh control signal SLEEP to H level by means of the logic circuit mounted thereon. Moreover, without preparing the refresh timer having the relatively large area in the respective DRAMs 101, the overall area can be significantly reduced. Furthermore, by including the frequency division operation of the output signal of the oscillator 501 in the refresh timer 401, the charge retention current can be readily altered.

Figure 10:
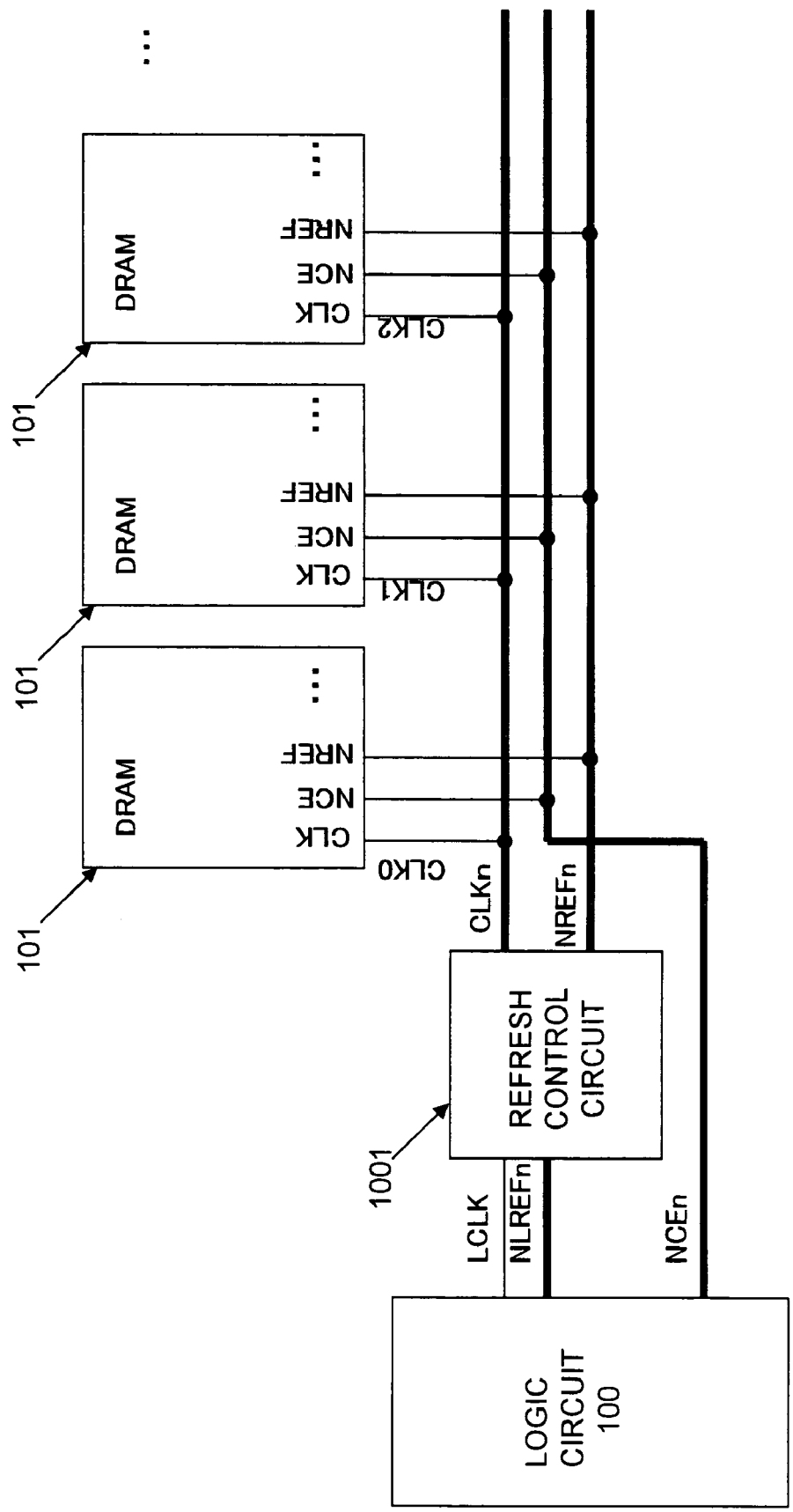
FIG. 10 is a block diagram of a semiconductor memory device and its control circuit on a System on Chip (SOC) of a semiconductor integrated circuit according to a second embodiment of the present invention.

FIG. 10 shows a block diagram of the semiconductor memory device and its control circuit on the System on Chip (SOC) of the semiconductor integrated circuit according to a second embodiment of the present invention.

In FIG. 10, reference numeral 1001 represents a refresh control circuit according to the second embodiment and CLKn represents a plurality of clock signals. The difference from that shown in FIG. 1 is that the plurality of clock signals CLKn (n=0, 1, 2 . . . ) are outputted from the refresh control circuit 1001 individually to the respective DRAMs 101.

Figure 11:
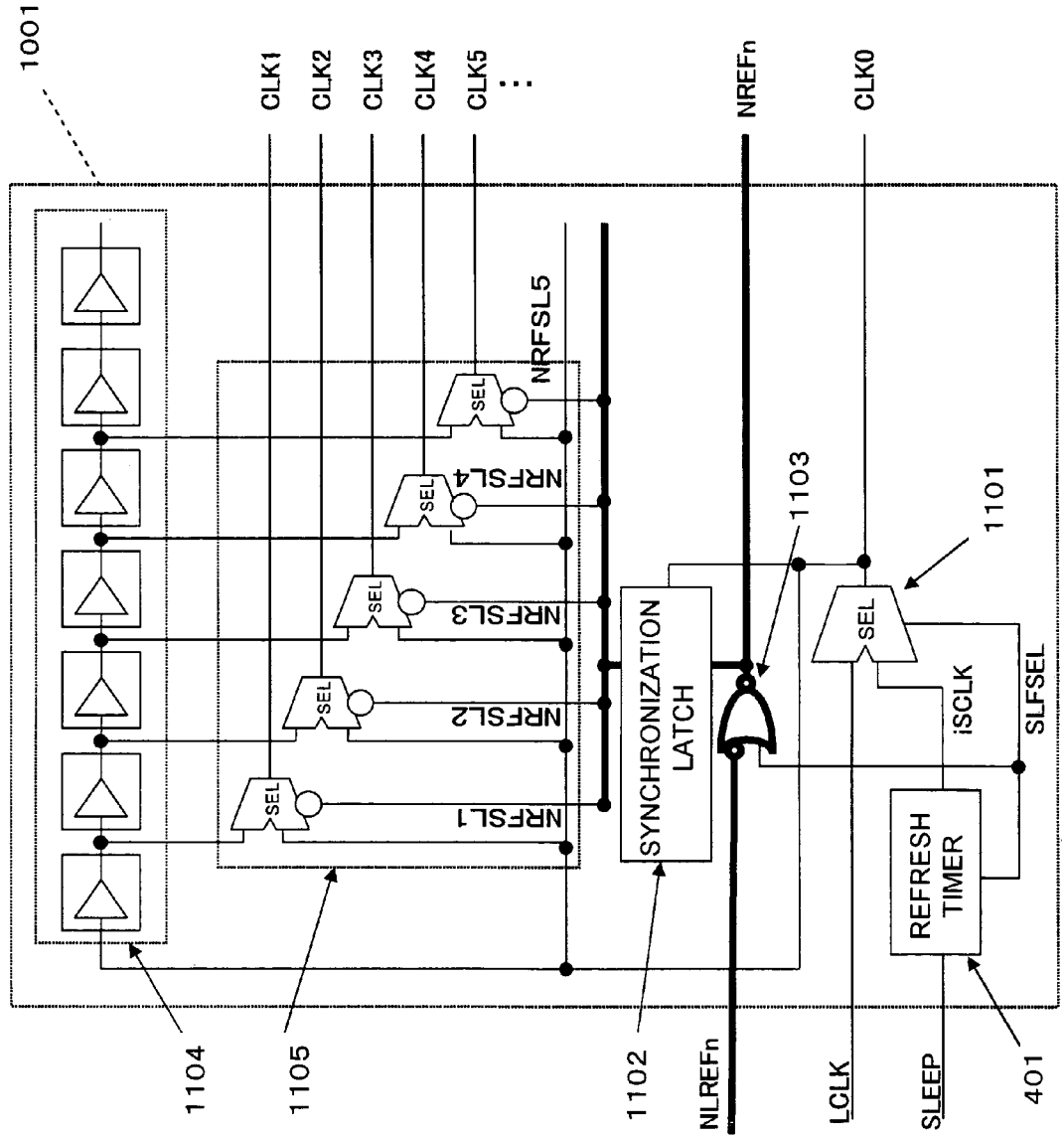
FIG. 11 is a circuit diagram of a refresh control circuit 1001 according to the second embodiment of the present invention.

FIG. 11 shows a circuit diagram of the refresh control circuit 1001 according to the second embodiment of the present invention.

In FIG. 11, reference numeral 1101 represents a selector (fourth selector), 1102 represents a plurality of synchronization latches, 1103 represents a plurality of NOR circuits, 1104 represents a delay element group, 1105 represents a selector group (fifth selector), and RFSLn (n=1, 2, 3 . . . ) represents a refresh selection signal. The refresh timer (second clock generating device) 401 is similar to that shown in FIG. 5.

The self-refresh clock (fourth clock signal) iSCLK outputted from the refresh timer 401 is inputted to one of the input terminals of the selector 1101, while the clock from the logic circuit (first clock signal) LCLK is inputted to the other input terminal. The self-refresh selection signal SLFSEL is inputted to the selection input of the selector 1101. A clock signal CLK0 among the plurality of clock signals CLKn is outputted from the selector 1101, which is in turn input to the arbitrary single or plurality of DRAMs 101.

The refresh enable signal inputted from the logic circuit NLREFn is inputted with a negative polarity to the plurality of NOR circuits 1103. The plurality of NOR circuits 1103 have two inputs respectively, wherein the self-refresh selection signal SLFSEL is inputted to the other inputs. The plurality of NOR circuits 1103 output the refresh enable signal input NREFn which is in turn input to the plurality of synchronization latches 1102. The clock signal CLK0 is inputted to the clock input of the plurality of synchronization latches 1102. The output from the plurality of synchronization latches 1102 is the refresh selection signal NRFSLn. The clock signal CLK0 is inputted to the delay element group 1104.

The delay element group 1104 includes the plurality of delay elements serially connected to each other, and the respective delay elements output the delayed signal of the clock signal CLK0. The selector group 1105 is configured by the plurality of selectors. The output from the plurality of the delay elements in the delay element group 1104 is inputted to the respective selectors. The plurality of selectors in the selector group 1105 are two-input selectors, wherein the clock signal CLK0 is inputted to the other inputs. The plurality of selectors in the selector group 1105 output the plurality of clock signals CLKn (n=1, 2 . . . )

The operations will be described hereinbelow as to the semiconductor integrated circuit according to the second embodiment of the present invention configured as described above.

Figure 12:
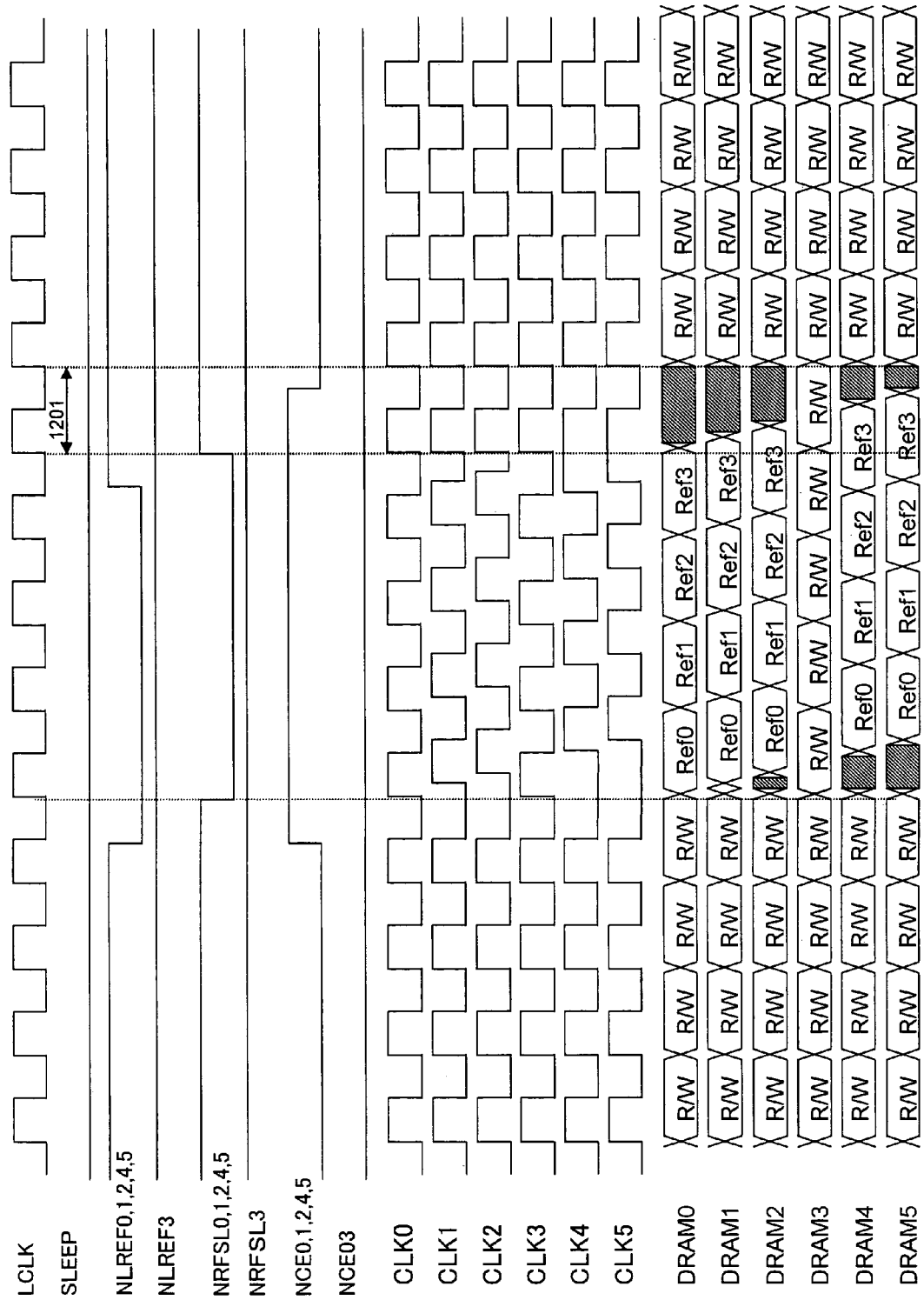
FIG. 12 is a timing waveform chart of an operation by the semiconductor integrated circuit shown in FIG. 10 in the case of a self-refresh control signal SLEEP being at L level.

FIG. 12 shows the operation by the semiconductor integrated circuit shown in FIG. 10 in the case of the self-refresh control signal SLEEP being at L level. When the self-refresh control signal SLEEP is at L level, the self-refresh selection signal SLFSEL is at L level and the selector 1101 selects the clock from the logic circuit LCLK. The refresh enable signal input NREFn is in the same logic state as the refresh enable signal from the logic circuit NLREFn. In response to the clock signal CLK0, the synchronization latch 1102 latches the logic of the refresh enable signal input NREFn and the selector group 1105 is selected.

The selector among the selector group 1105 received the refresh enable signal input NREFn (N is arbitrary) at L level recognizes the refresh operation and selects the clock signal passed through the delay element group 1104. The selector received the refresh enable signal input NREFn (N is arbitrary) at H level recognizes the read or write operation and selects the clock signal CLK0. (In this figure, NLREF0, 1, 2, 4, 5 of the refresh enable signal inputs NREFn are at L level, while NLREF3 is at H level.)

In this manner, by setting the refresh enable signal input NREFn at L level, the clock signal CLKn can be delayed to delay the refresh operation for the respective DRAMs 101 (in this figure, DRAM0, 1, 2 . . . ). Additionally, while the read/write operation is performed by setting the read/write enable signal NCE at L level as appropriate, an NOP (no-operation state) is required in 1-clock cycle represented by reference numeral 1201 in the figure for returning from the refresh operation to the read/write operation.

According to these operations, the refresh operation can be performed at the timing of the clock from the logic circuit LCLK which is the clock signal outputted from the logic circuit 100. Moreover, in the plurality of DRAMs 101, the refresh operations can be performed for the respective DRAMs 101 at the different timings each delayed by the predetermined time. Furthermore, if needed, the DRAM 101 performing the normal operation (read/write operation) or the DRAM 101 performing the refresh operation can be selected arbitrarily.

According to the foregoing, upon performing the refresh operation for the arbitrary DRAM 101, the increase in a peak current is suppressed by delaying the timing of the clock signal CLKn, allowing the refresh operation to be reliably performed while the increase in a voltage drop is inhibited.

Figure 13:
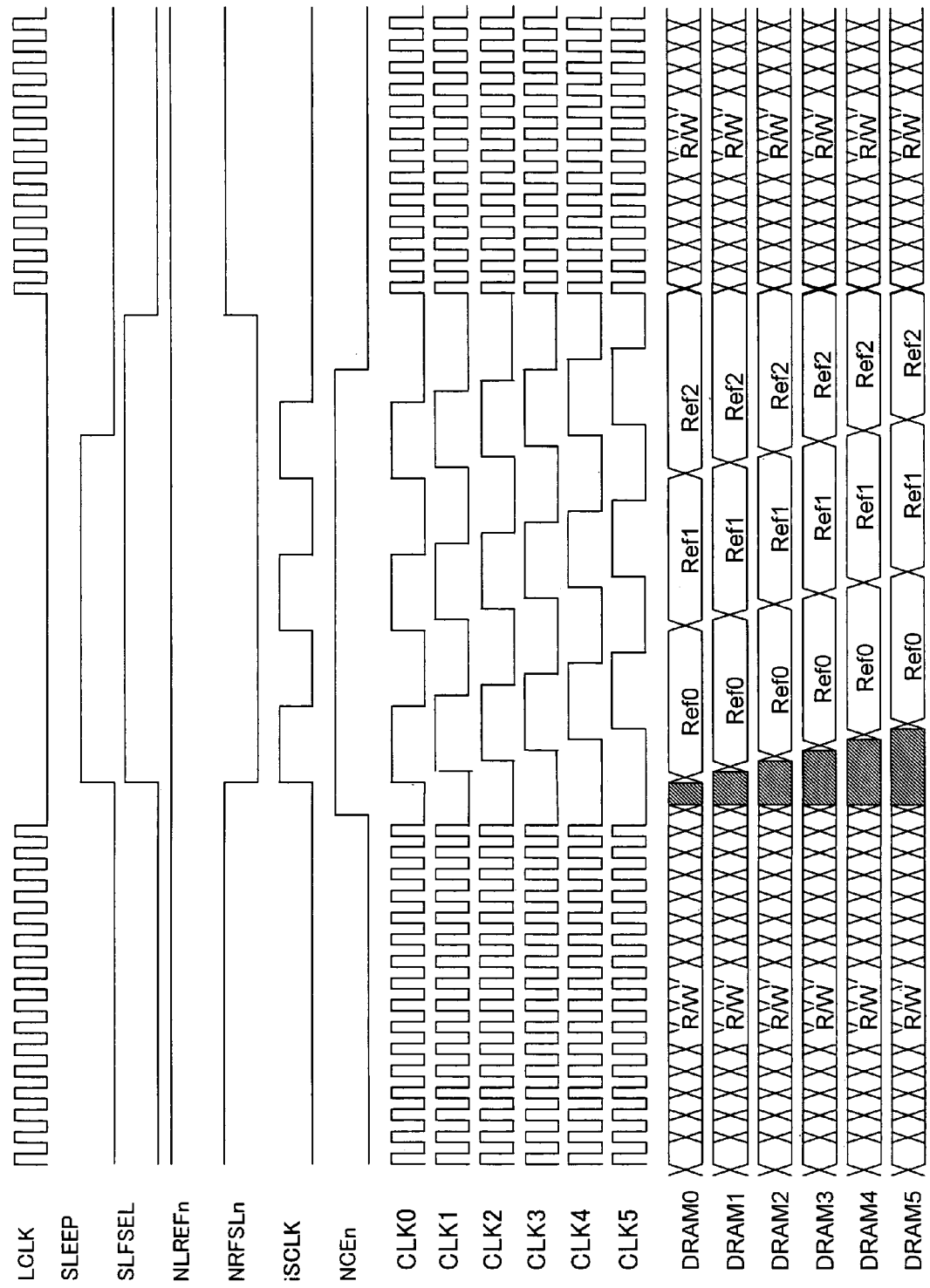
FIG. 13 is a timing waveform chart of the operation by the semiconductor integrated circuit shown in FIG. 10 in the case of the self-refresh control signal SLEEP being at H level.

FIG. 13 shows the operation by the semiconductor integrated circuit shown in FIG. 10 in the case of the self-refresh control signal SLEEP being at H level. When the self-refresh control signal SLEEP is at H level, the self-refresh selection signal SLFSEL is at H level. Additionally, the refresh timer 401 oscillates to output the clock signal to the self-refresh clock iSCLK.

The selector 1101 receives the self-refresh selection signal SLFSEL=H and outputs the self-refresh clock iSCLK to the clock signal CLK0. When the self-refresh selection signal SLFSEL is at H level, all the refresh enable signal inputs NREFn are at L level due to the NOR circuit 1103.

The synchronization latch 1102 latches the refresh enable signal input NREFn at the rising edge of the clock signal CLK0 and the selector group 1105 selects the clock signal passed through the delay element group 1104. For that reason, when the self-refresh control signal SLEEP is at H level, the plurality of DRAMs 101 respectively receive the inputs of the clock signals CLKn at the different timings with each other. Since all the refresh enable signal inputs NREFn are at L level, all the DRAMs 101 perform the refresh operation.

The peak current can be suppressed by the clock signals CLKn inputted at the different timings, allowing the refresh operation to be reliably performed while the increase in the voltage drop is inhibited. Moreover, from the viewpoint of the logic circuit 100, the refresh operation can be reliably performed only by controlling the self-refresh control signal SLEEP and the read/write enable signal NCE.

Figure 14:
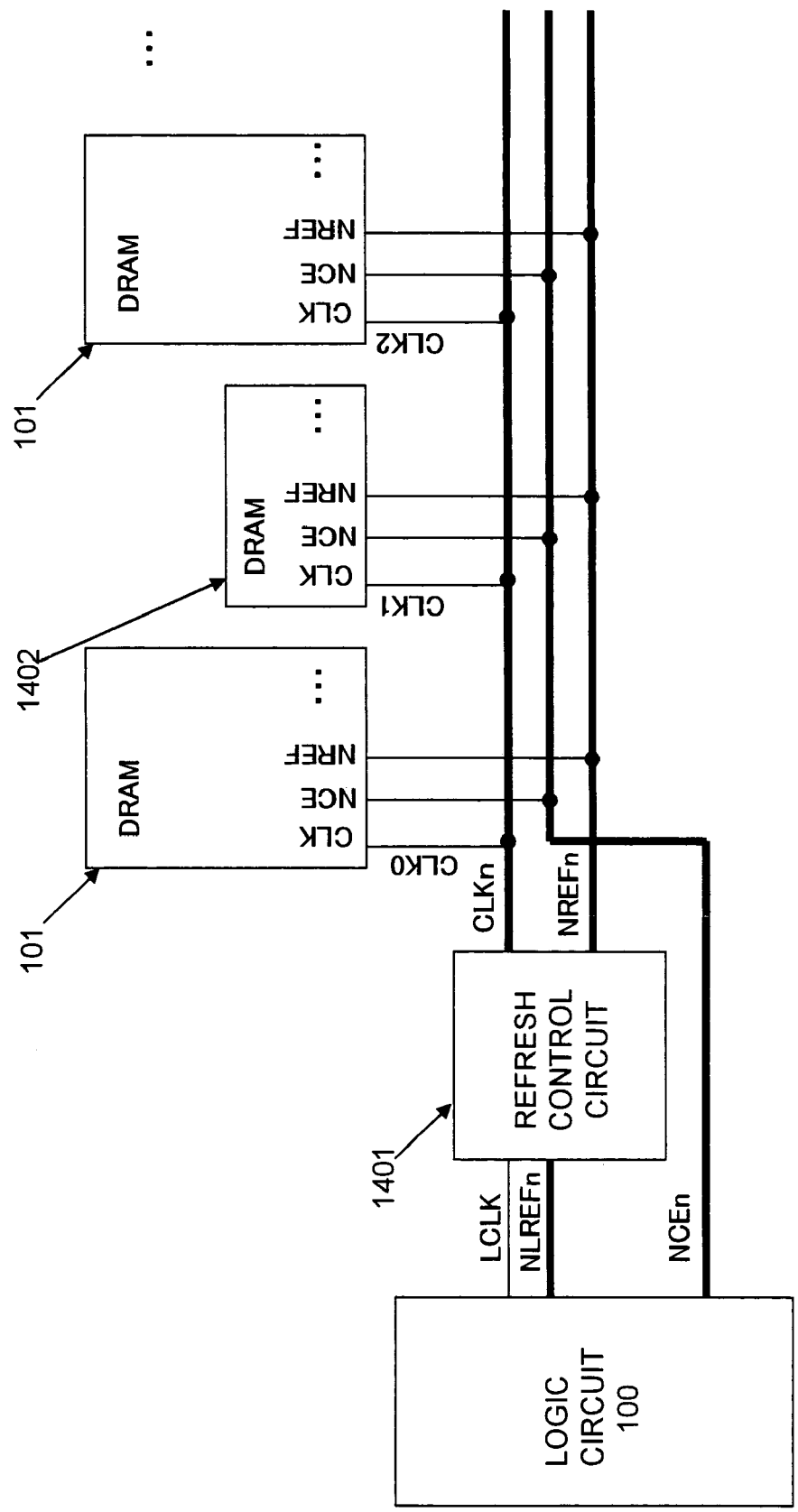
FIG. 14 is a block diagram of a semiconductor integrated circuit on a System on Chip (SOC) of a semiconductor integrated circuit according to a third embodiment of the present invention.

FIG. 14 shows a block diagram of the semiconductor integrated circuit on the System on Chip (SOC) of the semiconductor integrated circuit according to a third embodiment of the present invention.

In FIG. 14, reference numeral 1401 represents a refresh control circuit according to the third embodiment and 1402 represents a DRAM. The differences from that shown in FIG. 10 are that the internal circuitry of the refresh control circuit 1401 is different from that in shown in FIG. 10 and that the number of the word lines WL arranged in the DRAM 1402 is half of that in the DRAM 101, resulting in a reduction in capacity to half. Since the DRAM 1402 has the fewer word lines WL compared to those in the DRAM 101, the top-level address among the output addresses from the internal refresh counter 204 is fixed to L level, allowing the refresh cycle to be reduced to half.

Figure 15:
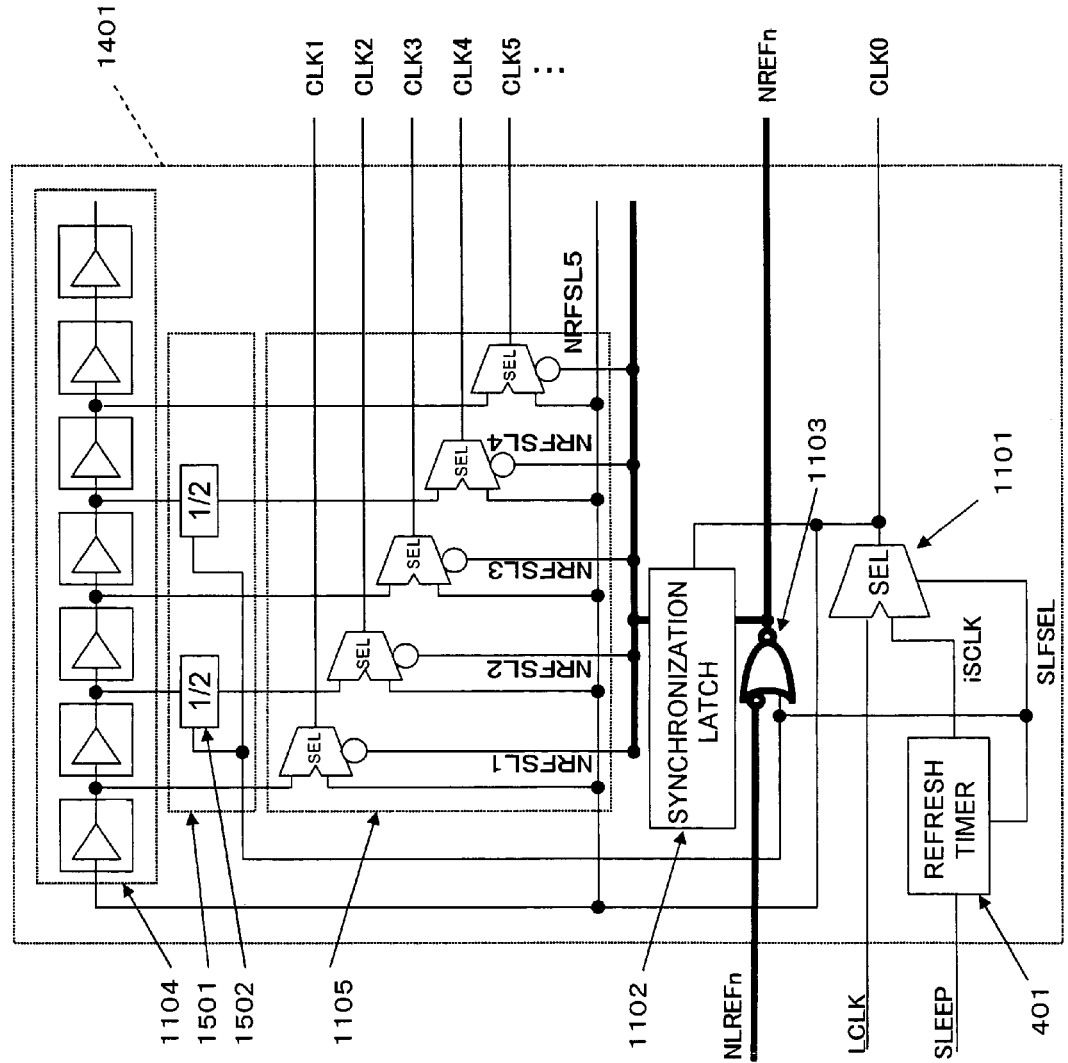
FIG. 15 is a circuit diagram of a refresh control circuit 1401 according to the third embodiment of the present invention.

FIG. 15 is a circuit diagram of the refresh control circuit 1401 according to the third embodiment of the present invention. In FIG. 15, reference numeral 1501 represents a clock frequency divider group and 1502 represents a frequency divider. The difference from the refresh control circuit 1001 shown in FIG. 11 is that the output from the delay element group 1104 is inputted to the clock frequency divider group 1501 while the output from the clock frequency divide group 1501 is inputted to the selector group 1105.

The clock frequency divider group 1501 includes the arbitrary number of the frequency dividers 1502. The frequency divider 1502 is arranged for the output from the delay element group 1104 corresponding to the clock signal CLKi connected to the DRAM 1402 having the half number of the word lines WL of the DRAM 101.

Figure 16:
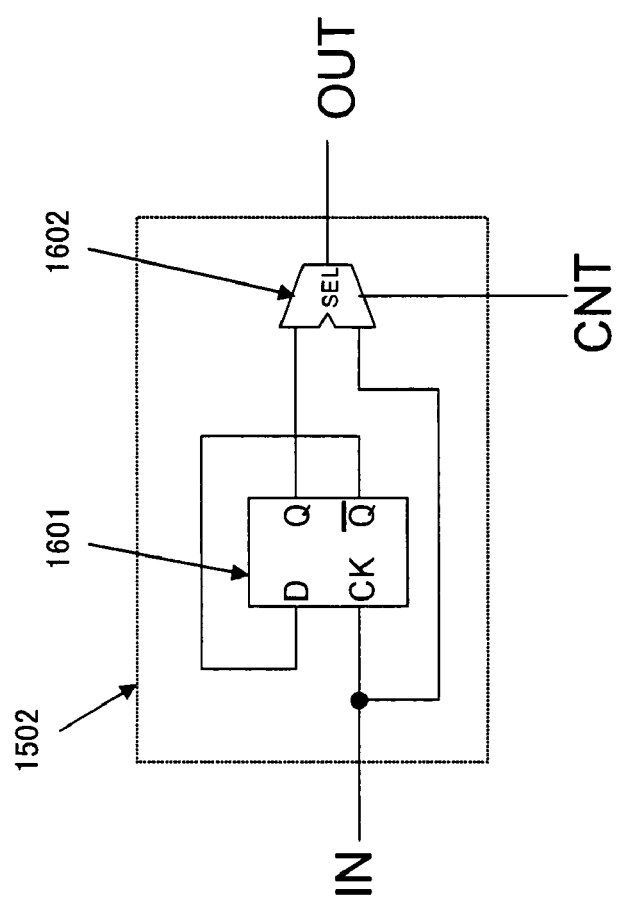
FIG. 16 is a diagram showing an example of a circuit of a frequency divider 1502.

FIG. 16 is an example of the circuit of the frequency divider 1502. In FIG. 16, reference numeral 1601 represents a delay flip-flop, 1602 represents a selector, IN represents a clock input, OUT represents a clock output, and CNT represents a control input.

The output from the delay element group 1104 in FIG. 15 is inputted to the clock input IN. The clock input IN is inputted to a clock input side of the delay flip-flop 1601, while the opposite phase output of a Q output of the delay flip-flop 1601 is connected to a D input side of the delay flip-flop 1601. The Q output of the delay flip-flop 1601 and the clock input IN are inputted to the selector 1602. A selector 1602 output is the clock output OUT which is a terminal connected to the selector group 1105 in FIG. 15. The control input CNT is connected to the selector 1602 to select either the Q input of the delay flip-flop when the control input CNT is at H level or the clock input IN when it is at L level.

The operations will be described hereinbelow as to the semiconductor integrated circuit according to the third embodiment of the present invention configured as described above.

Figure 17:
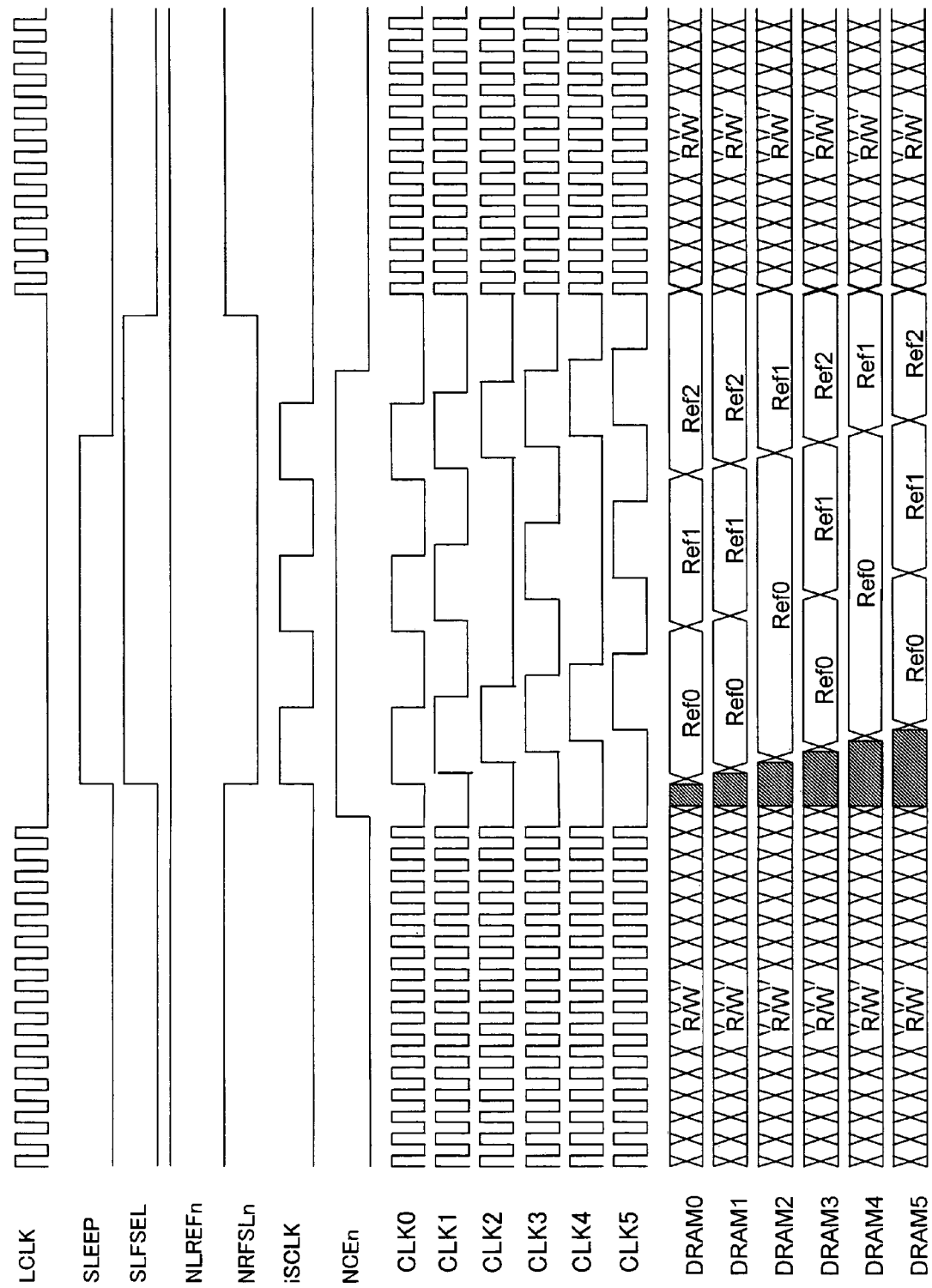
FIG. 17 is a timing waveform chart of an operation by the semiconductor integrated circuit shown in FIG. 14 in the case of the self-refresh control signal SLEEP being at H level.

FIG. 17 shows the operation by the semiconductor integrated circuit shown in FIG. 14 in the case of the self-refresh control signal SLEEP being at H level. When the self-refresh control signal SLEEP is at H level, the self-refresh selection signal SLFSEL is at H level. Additionally, the refresh timer 401 oscillates to output the clock signal to the self-refresh clock iSCLK. The selector 1101 receives the self-refresh selection signal SLFSEL=H and outputs the self-refresh clock iSCLK to the clock signal CLK0.

Moreover, when the self-refresh selection signal SFLSEL is at H level, all the refresh enable signal inputs NREFn are at L level due to the NOR circuit 1103. The synchronization latch 1102 latches the refresh enable signal input NREFn at the rising edge of the clock signal CLK0.

Among the outputs of the delay element group 1104, the predetermined outputs are inputted directly to the selector group 1105 while the rest are inputted to the selector group 1105 through the clock frequency divider group 1501. Since the self-refresh selection signal SLFSEL is at H level, the clock frequency divider group 1501 outputs the clock signal divided into frequency of the input thereto from the delay element group 1104 output to the selector group 1105 (CLK 2 and CLK4 in the figure).

For that reason, when the self-refresh control signal SLEEP is at H level, the plurality of DRAMs 101 respectively receive the inputs of the clock signals CLKn at the different timings with each other. Since all the refresh enable signal inputs NREFn are at L level, all the DRAMs 101 perform the refresh operation. The peak current can be suppressed by the clock signals CLKn inputted at the different timings, allowing the refresh operation to be reliably performed while the increase in the voltage drop is inhibited. From the viewpoint of the logic circuit 100, the refresh operation can be reliably performed only by controlling the self-refresh control signal SLEEP and the read/write enable signal NCE.

Moreover, as to the DRAM 1402 having fewer refresh cycles than those of the DRAM 101, it can prevent performing the unnecessary refresh operation by extending the interval between the clock signals by the frequency divider 1501 during the charge retention period where the self-refresh control signal SLEEP is at H level, resulting in the decrease in the power consumption.

Figure 18:
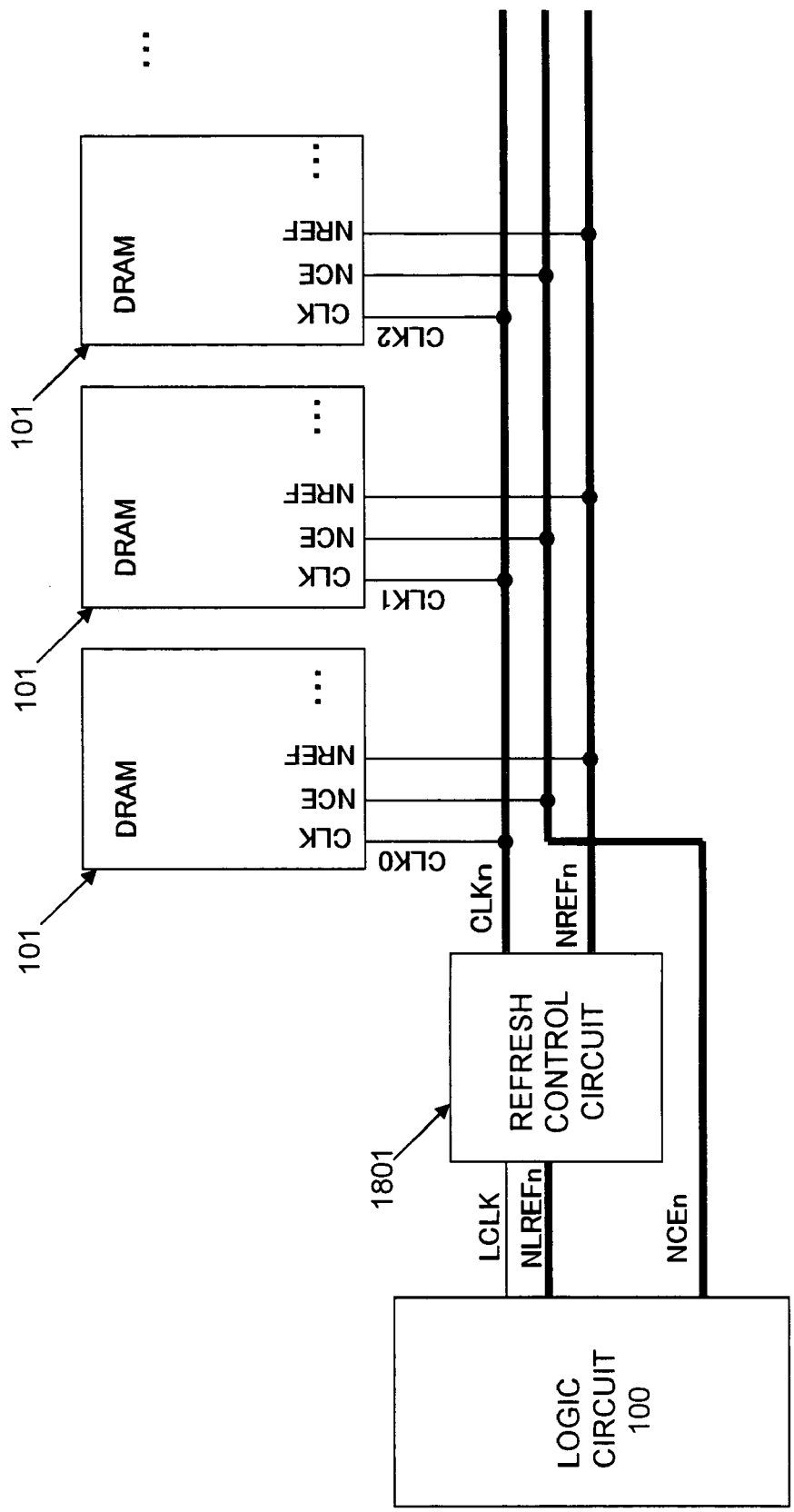
FIG. 18 is a block diagram of a semiconductor integrated circuit on a System on Chip (SOC) of a semiconductor integrated circuit according to a fourth embodiment of the present invention.

FIG. 18 shows a block diagram of the semiconductor integrated circuit on the System on Chip (SOC) of the semiconductor integrated circuit according to a fourth embodiment of the present invention.

In FIG. 18, reference numeral 1801 represents a refresh control circuit according to the fourth embodiment. The difference from that shown in FIG. 10 is that a the refresh control circuit 1801 is arranged instead of the refresh control circuit 1001, while there is no other particular change.

Figure 19:
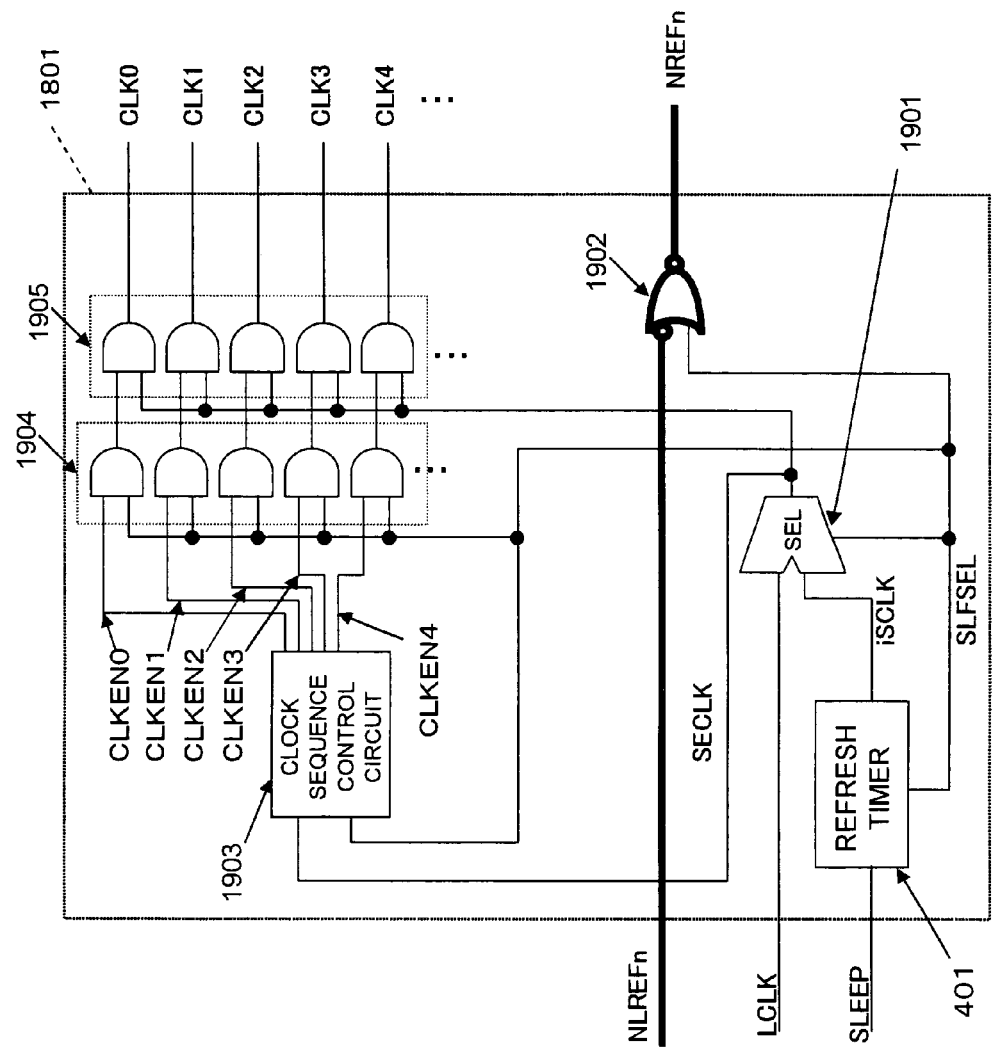
FIG. 19 is a circuit diagram of a refresh control circuit according to the fourth embodiment.

FIG. 19 is a circuit diagram of the refresh control circuit 1801 according to the fourth embodiment. In FIG. 19, reference numeral 1901 represents a selector (sixth selector), 1902 represents a plurality of NOR circuits, 1903 represents a clock sequence control circuit, 1904 and 1905 represent AND element groups, SECLK represents output of the selector 1901, and CLKENn (n=0, 1, 2, 3 . . . ) represents a clock selection signal. The refresh timer (third clock generating device) 401 is similar to that shown in FIG. 5.

The self-refresh clock (fifth clock signal) iSCLK outputted from the refresh timer 401 is inputted to one of the input terminals of the selector 1901, while the clock from the logic circuit (first clock signal) LCLK is inputted to the other input terminal. The self-refresh selection signal SLFSEL is inputted to the selection input of the selector 1901. The refresh enable signal inputted from the logic circuit NLREFn is inputted with a negative polarity to the plurality of NOR circuits 1902. The plurality of NOR circuits 1902 have two inputs respectively, wherein the self-refresh selection signal SLFSEL is inputted to the other inputs. The plurality of NOR circuits 1902 output the refresh enable signal input NREFn.

The output SECLK from the selector 1901 is inputted to the clock sequence control circuit 1903. The self-refresh selection signal SLFSEL is also input to the clock sequence control circuit 1903. The clock sequence control circuit 1903 outputs the plurality of clock selection signals CLKENn, which are inputted respectively to one of the input terminals of the plurality of two-input AND elements arranged in the AND element group 1904. To the other input terminals of the plurality of two-input AND elements arranged in the AND element group 1904, the self-refresh selection signal SLFSEL is inputted. The output from the AND element group 1904 is inputted to one of the input terminals of the plurality of two-input AND elements arranged in the AND element group 1905. To the other input terminals of the plurality of two-input AND elements, the output SECLK from the selector 1901 is inputted, which is outputted as the clock signal CLKn.

Figure 20:
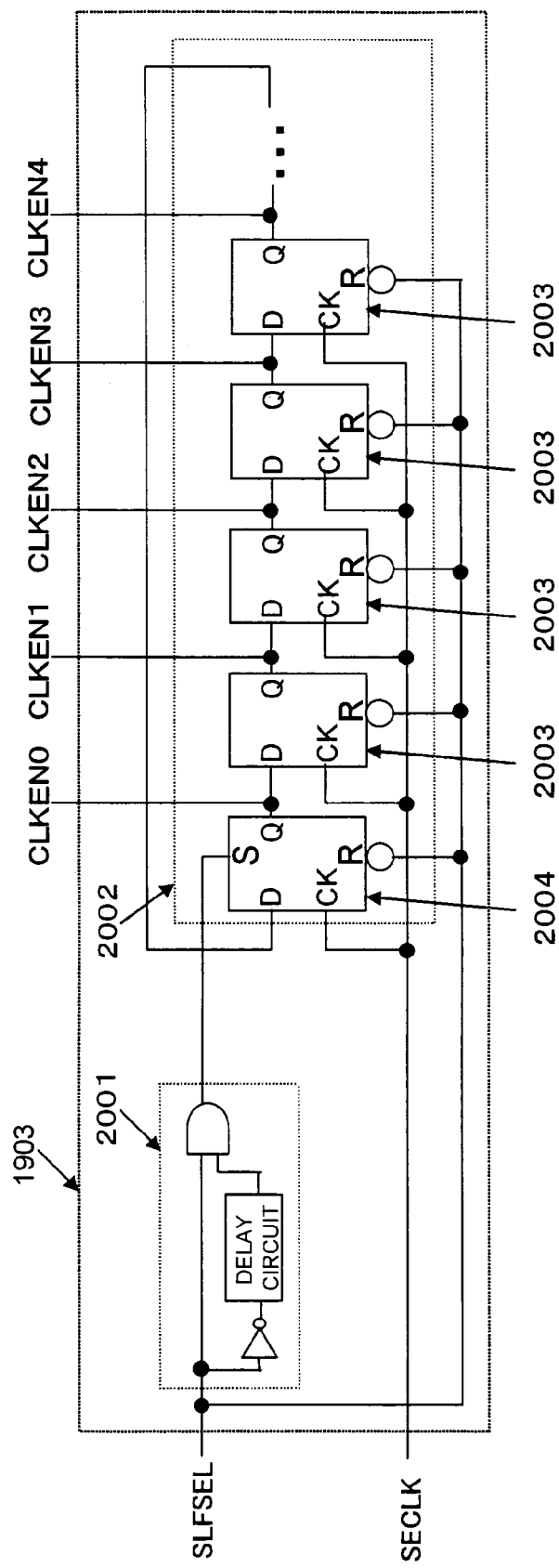
FIG. 20 is a circuit diagram showing an example of a clock sequence control circuit 1903.

FIG. 20 is an example of the clock sequence control circuit 1903. In FIG. 20, reference numeral 2001 represents a one-shot circuit, 2002 represents a delay flip-flop group, 2003 represents a delay flip-flop, and 2004 represents a delay flip-flop having a set function.

The self-refresh selection signal SLFSEL is inputted to the one-shot circuit 2001. The output from the one-shot circuit 2001 is inputted to the delay flip-flop group 2002. The delay flip-flop group 2002 includes the plurality of delay flip-flops 2003 which are arranged in a ring with a Q output of one flip-flop connected to a D input of the next. Only one flip-flop 2004 of the flip-flops arranged in a ring is provided with the set function. The respective delay flip-flops output the clock selection signal CLKENn which is inputted to the plurality of two-input AND elements arranged in the AND element group 1904. The output of the one-shot circuit 2001 is connected to a set terminal of the delay flip-flop 2004 having the set function. All the delay flip-flops arranged in the delay flip-flop group 2002 are provided with a reset terminal with a negative polarity, wherein the self-refresh selection signal SLFSEL is connected thereto.

Figure 21:
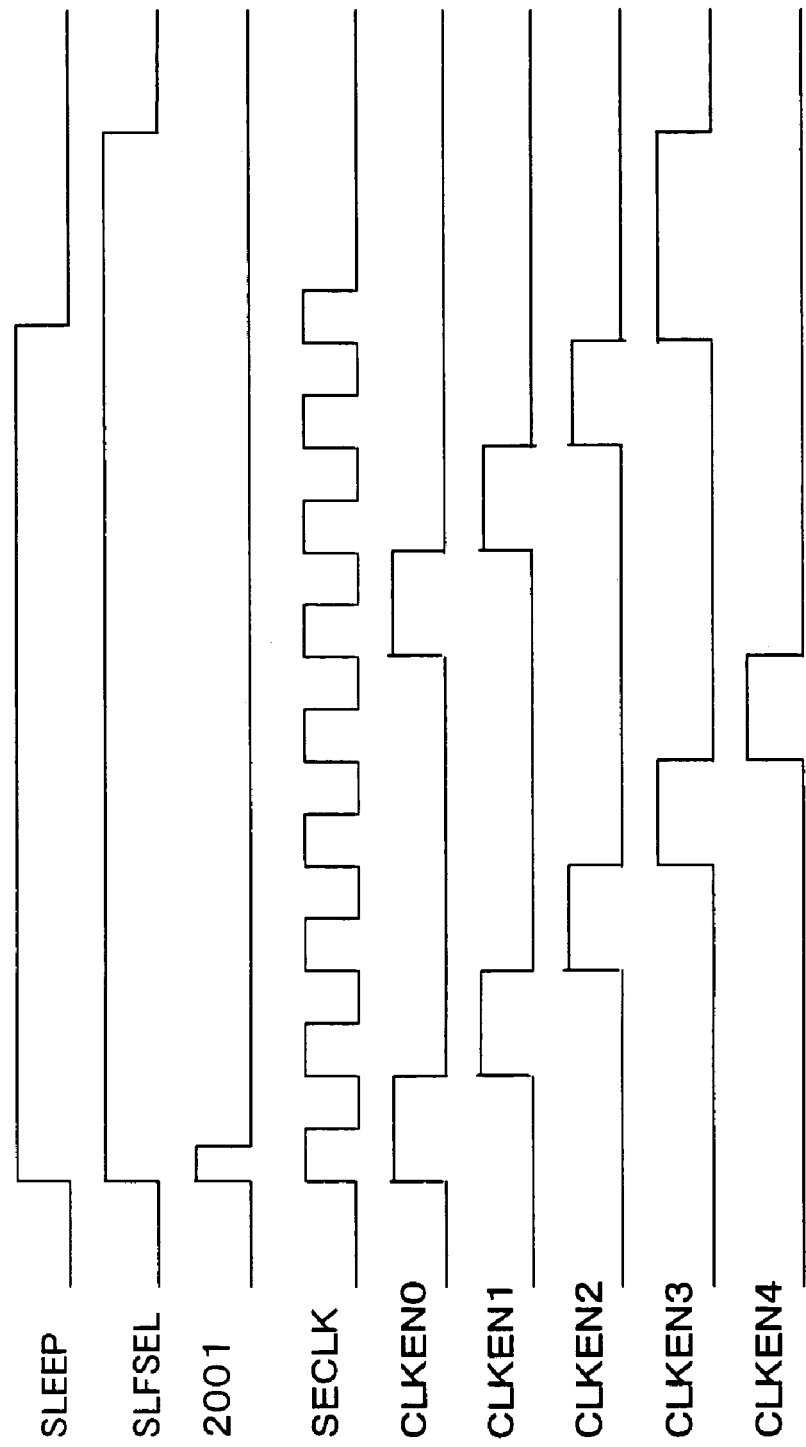
FIG. 21 is a diagram illustrating an operation by the clock sequence control circuit 1903.

FIG. 21 illustrates the operation by the clock sequence control circuit 1903. When the self-refresh control signal SLEEP attains H level, the self-refresh selection signal SLFSEL attains H level by means of the refresh timer 401. When the self-refresh selection signal SLFSEL attains H level, H level is outputted as the output of the one-shot circuit 2001 for only the predetermined delay time. Upon reception of the one-shot pulse, H level is outputted as the clock selection signal CLKEN0 outputted from the delay flip-flop 2004 having the set function. Then, the output is propagated to the delay flip-flops 2003 connected in a ring in synchronization with the rising edges of the output SECLK from the selector 1901 to output the clock selection signals CLKENn (n=1, 2 . . . ), i.e., the sequential signals, to the plurality of two-input AND elements arranged in the AND element group 1904.

When the self-refresh control signal SLEEP attains L level, the output SECLK from the selector 1901 is fixed to L level and the self-refresh selection signal SLFSEL attains L level. In response thereto, all the delay flip-flops 2003 connected in a ring output the clock selection signals CLKENn at L level.

Figure 22:
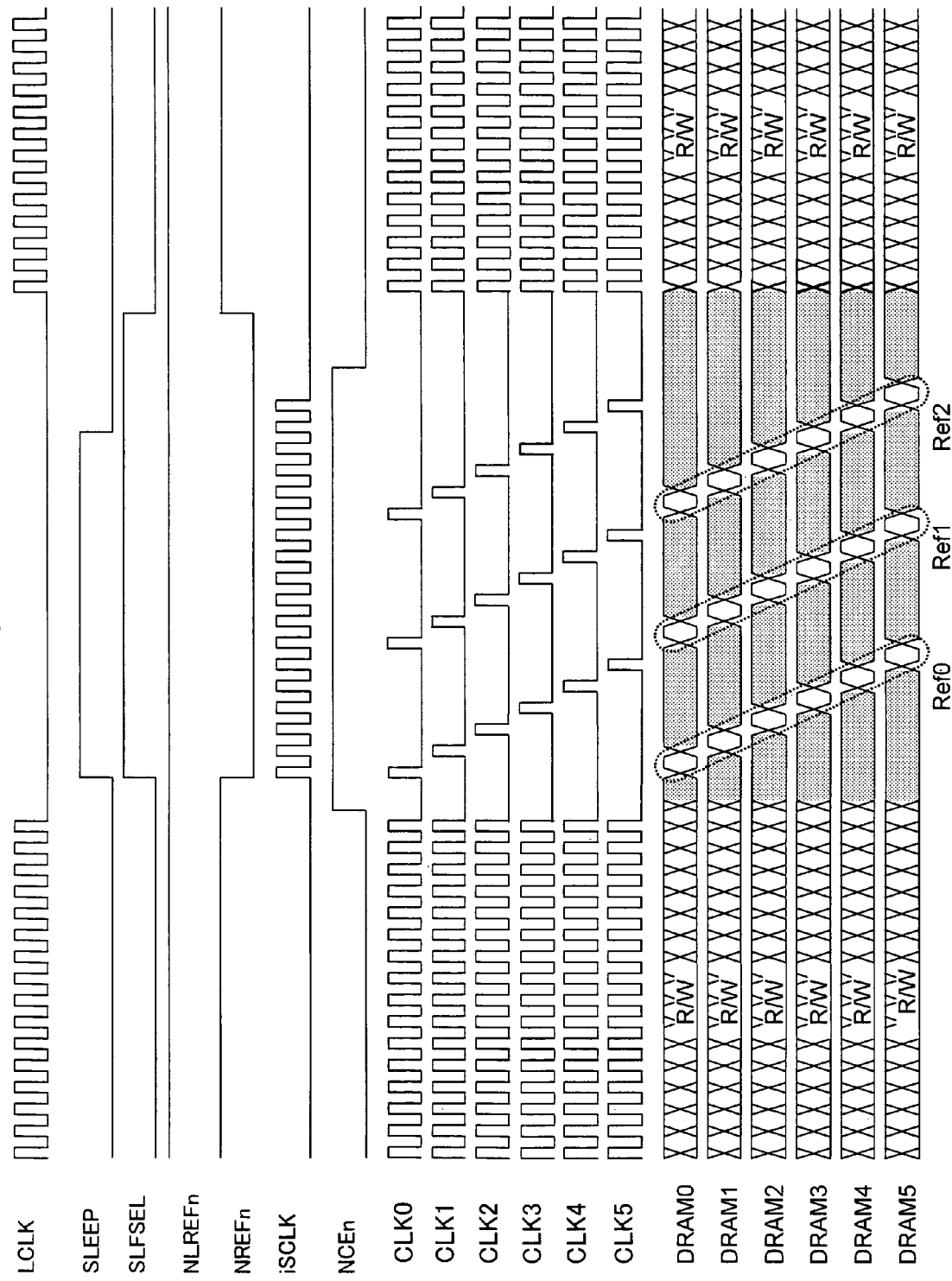
FIG. 22 is a timing waveform chart of the semiconductor integrated circuit according to the fourth embodiment.

Furthermore, the overall operation is described with reference to FIG. 22. When the self-refresh control signal SLEEP attains H level, the self-refresh selection signal SLFSEL attains H level by means of the refresh timer 401 and the cyclic signal is outputted to the self-refresh clock iSCLK. When the self-refresh selection signal SLFSEL attains H level, one of the inputs of the respective two-input AND elements in the AND element group 1904 attains H level. Moreover, when the self-refresh selection signal SLFSEL attains H level, the selector 1901 selects the self-refresh clock iSCLK and the sequential clock signals are outputted as the clock selection signals CLKENn as shown in FIG. 19 in synchronization with the rising edges of the output SECLK from the selector 1901. For that reason, the sequential signal of the output SECLK from the selector 1901 applies the clock signal in sequence to the clock signals CLKn (n=0, 1, 2) at the every rising edge. Since the self-refresh selection signal SLFSEL is at H level, the refresh enable signal input NREFn is at L level.

According to the foregoing operations, the plurality of DRAMs 101 can perform the refresh operation sequentially by the output of the self-refresh clock iSCLK from the refresh timer 401 is provided as the clock output to the plurality of DRAMs 101 one by one. For that reason, the refresh operation can be performed while the peak current is suppressed, without the need of the control of the logic circuit 100 and the increase in the circuit area.

Figure 23:
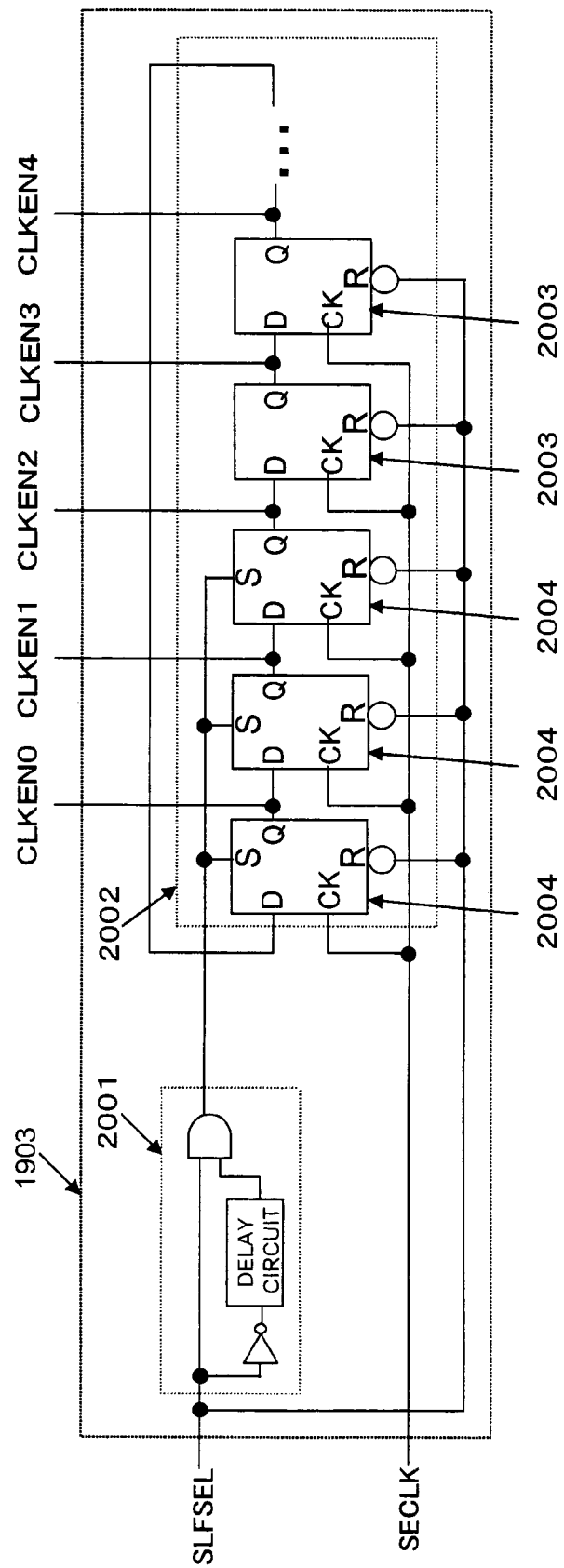
FIG. 23 is a circuit diagram showing an example of the clock sequence control circuit 1903 according to another embodiment.

FIG. 23 is an example of the circuit diagram of the clock sequence control circuit 1903 according to another embodiment. As compared to that in FIG. 20, the plurality of the delay flip-flops 2004 having the set function are provided among the plurality of the delay flip-flops arranged in the delay flip-flop group 2002. In this configuration, the arbitrary number of the DRAMs 101 can simultaneously perform the refresh operation by preparing the arbitrary number of the delay flip-flops 2004 having the set function. In this case, the relatively frequent refresh operation can be performed compared to the configuration in FIG. 20 while an increase in peak current is suppressed within an acceptable range, without the need of the control of the logic circuit 100 and the increase in the circuit area.

Figure 24:
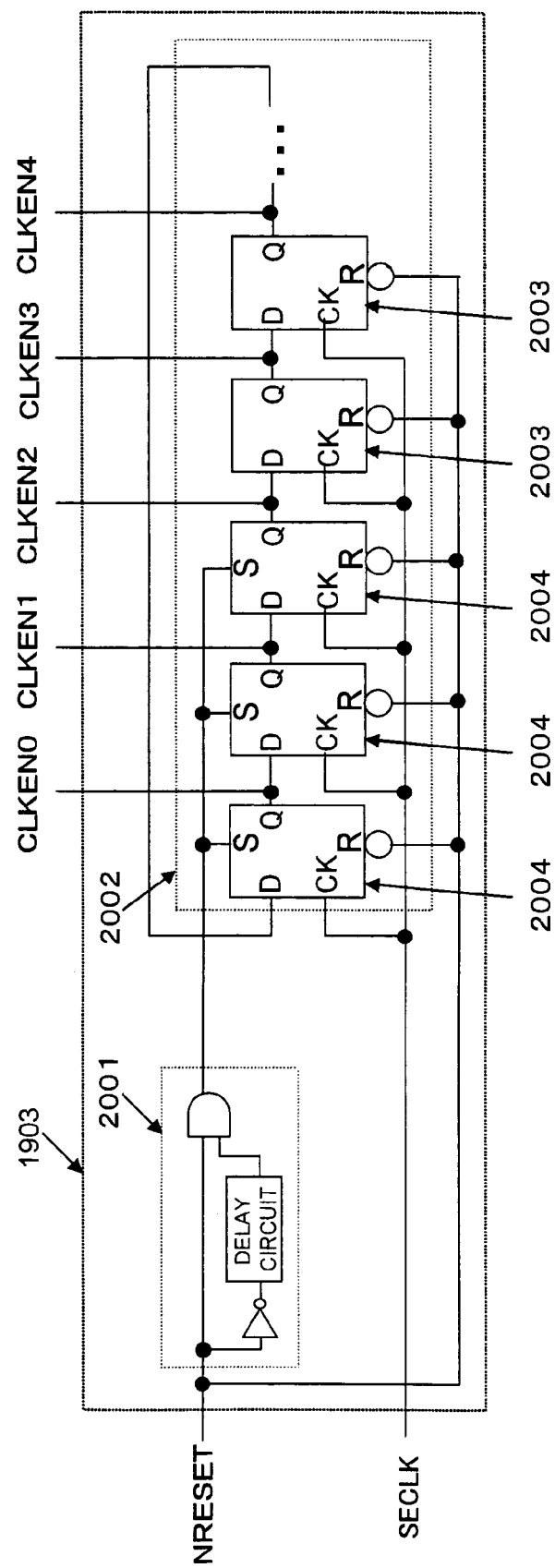
FIG. 24 is a circuit diagram showing an example of the clock sequence control circuit 1903 according to yet another embodiment.
Figure 25:
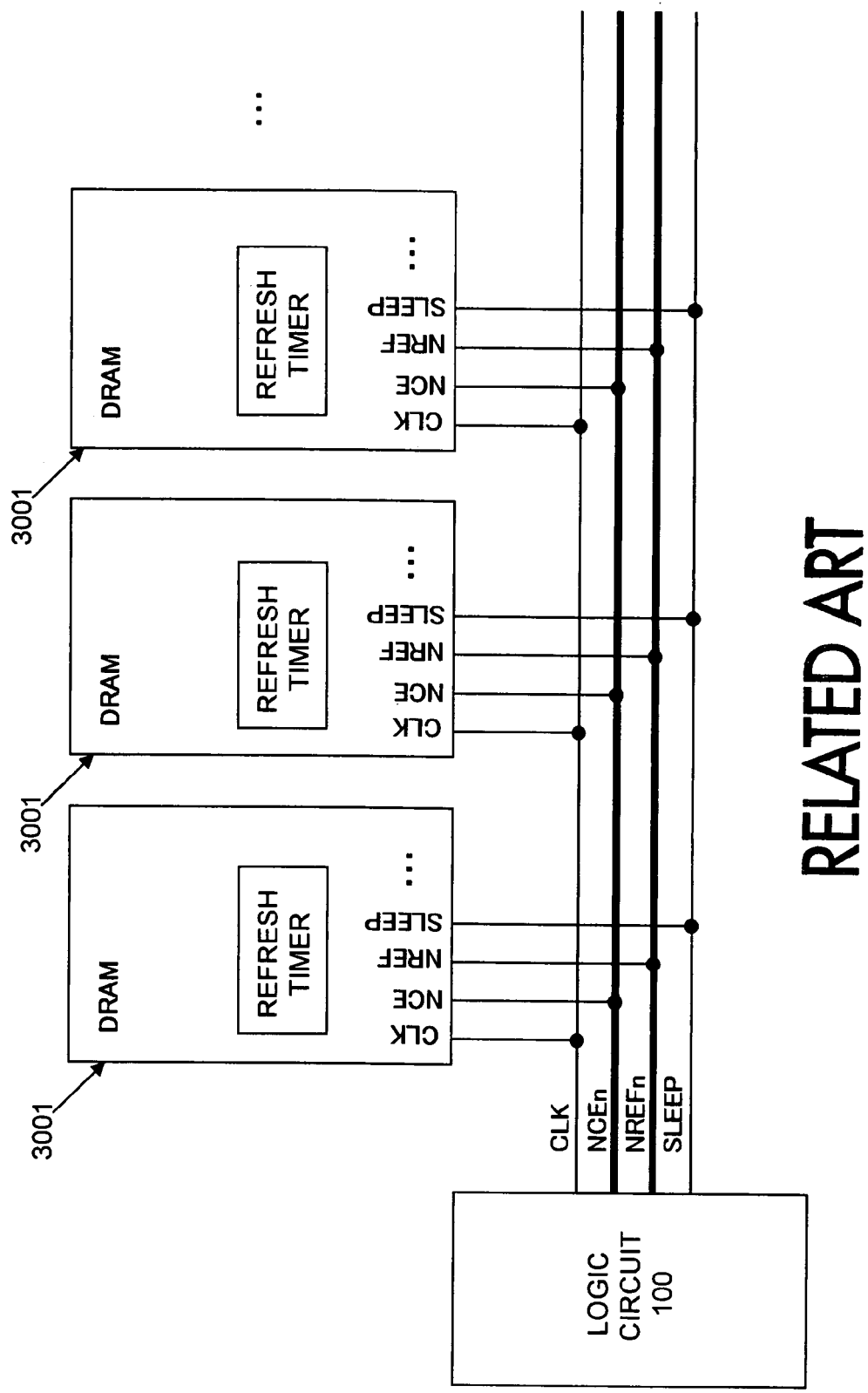
FIG. 25 is a block diagram of a conventional semiconductor integrated circuit.
Figure 26:
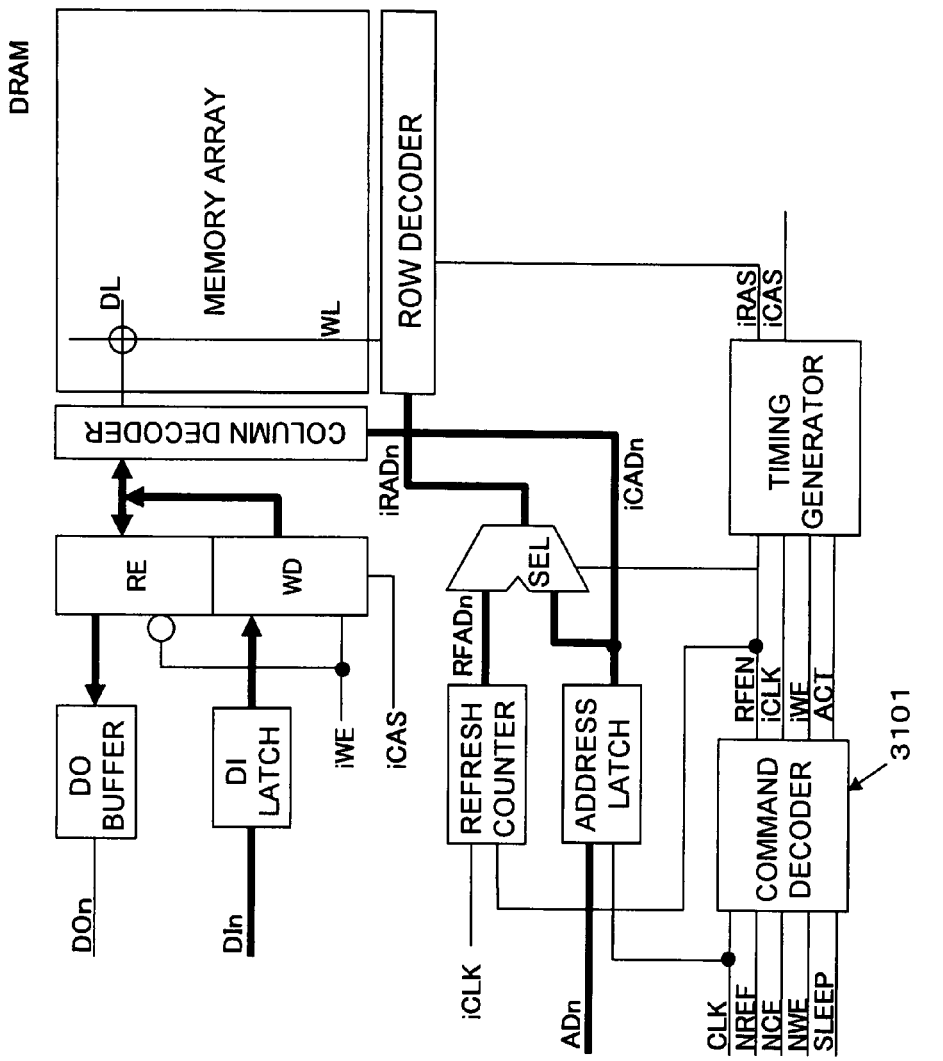
FIG. 26 is an internal circuit diagram of a DRAM 3001 mounted on the conventional semiconductor integrated circuit.
Figure 27:
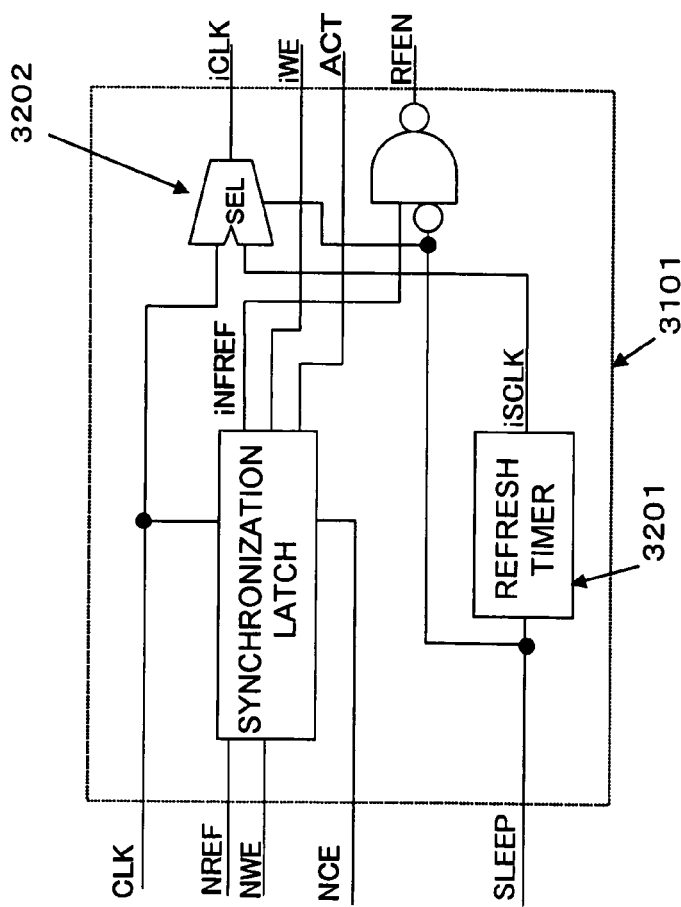
FIG. 27 is a diagram showing an example of a command decoder 3101.

FIG. 24 is an example of the circuit diagram of the clock sequence control circuit 1903 according to yet another embodiment. Symbol NRESET represents a reset signal. As compared to that in FIG. 20, the difference is that the reset signal NRESET is inputted instead of the self-refresh selection signal SLFSEL. The reset signal NRESET is inputted from the logic circuit 100.

In the case where the self-refresh selection signal SLFSEL is inputted as shown in FIG. 20, the delay flip-flop group 2002 is reset upon the self-refresh operation being aborted. Thus, the DRAM 101 with the clock signal CLK0 connected thereto is refreshed relatively more frequently compared to the other DRAMs 101, resulting in the inefficiency in the operation. In the configuration shown in FIG. 24, although it requires the control of the reset signal NRESET by the logic circuit 100, there is no need to reset the delay flip-flop group 2002 unnecessarily. Thus, when the self-refresh operation is once aborted and then restarted, it can start the operation from the DRAM 101 which aborted the refresh operation among the plurality of DRAMs 101, resulting in the efficient refresh operation. Moreover, the reset signal NRESET may be the output of a power-on reset circuit which outputs L level for only the predetermined period from the start-up of the power source. Here, the selection condition of the clock sequence control circuit is set only once after the predetermined period from the start-up of the power source has elapsed. In this case, the delay flip-flop group 2002 can be set to the predetermined condition at the start-up of the power source.

INDUSTRIAL APPLICABILITY

A semiconductor integrated circuit according to the present invention can perform a refresh operation for a plurality of DRAMs and thus hold data by the simple control only by setting a self-refresh control signal SLEEP to H level by means of a logic circuit mounted thereon. Moreover, without preparing a refresh timer having the relatively large area in the respective DRAMs, the overall area can be significantly reduced. The present invention is therefore useful for a semiconductor integrated circuit including a plurality of memory devices which require the refresh operation to be performed, for example the Dynamic Random Access Memories, are mounted thereon.

What is claimed is:
1. A semiconductor integrated circuit comprising a logic circuit and a plurality of semiconductor memory devices formed on a semiconductor substrate, and a refresh control circuit for controlling the plurality of semiconductor memory devices, wherein said plurality of semiconductor memory devices are clock synchronous, including a clock input and a refresh function for refreshing data in a memory cell arranged therein;

said logic circuit outputs a sleep control signal and a first clock signal;

said refresh control circuit receives the sleep control signal and said first clock signal outputted from said logic circuit, and outputs a second clock signal to clock inputs of said plurality of semiconductor memory devices;

said refresh control circuit outputs said first clock signal as said second clock signal when the sleep control signal is in a first state to enable the control of said plurality of semiconductor memory devices by said logic circuit; and said refresh control circuit outputs a clock signal having a clock cycle different from that of said first clock signal as said second clock signal when said sleep control signal is in a second state.

2. The semiconductor integrated circuit according to claim 1, wherein
- said plurality of semiconductor memory devices include a refresh control terminal,
- said logic circuit outputs a first refresh control signal,
- said refresh control circuit receives said first refresh control signal and outputs a second refresh control signal to said refresh control terminal,
- said refresh control circuit outputs said first refresh control signal as said second refresh control signal when said sleep control signal is in the first state, and
- said refresh control circuit outputs a predetermined electric potential as said second refresh control signal when said sleep control signal is in the second state and said plurality of semiconductor memory devices are set to a refresh condition.

3. The semiconductor integrated circuit according to claim 2, each of said plurality of semiconductor memory devices comprising:
- a plurality of memory cells;
- a plurality of word lines and a plurality of bit lines connected to said plurality of memory cells;
- a column decoder connected to said plurality of bit lines, having a function to amplify data in said plurality of memory cells;
- a row decoder for driving said plurality of word lines;
- a first selector for outputting a first address signal inputted to said row decoder and receiving inputs of a second address signal and a third address signal;
- an address latch circuit for outputting said second address signal and receiving an external address signal;
- a refresh address counter for outputting said third address signal; and
- an internal refresh selection signal for controlling said first selector,
- wherein said internal refresh selection signal is controlled by said second refresh control signal,.
- said first selector selects said second address signal as said first address signal when said internal refresh selection signal is in a first state, and
- said first selector selects said third address signal as said first address signal when said internal refresh selection signal is in a second state.

4. The semiconductor integrated circuit according to claim 1, said refresh control circuit comprising:
- a first clock generating device for outputting a third clock signal when said sleep control signal is at the predetermined electric potential; and
- a second selector for receiving said first clock signal and said third clock signal and outputting said second clock signal,
- wherein said second selector is controlled by said sleep control signal,
- said second selector outputs said first clock signal as said second clock signal when said sleep control signal is in the first state, and
- said second selector outputs said third clock signal as said second clock signal when said sleep control signal is in the second state.

5. The semiconductor integrated circuit according to claim 4, said first clock generating device comprising: s a ring oscillator; a first frequency divider to divide the output of said ring oscillator in a predetermined cycle; and a third selector to select either of the output from said ring oscillator or the output from said first frequency divider,
- wherein the output of said third selector is said third clock signal.

6. The semiconductor integrated circuit according to claim 5, said refresh control circuit comprising:
- fuse means; and
- a fuse detection circuit for detecting a disconnection condition of said fuse means,
- wherein said third selector selects either of the output from said ring oscillator or the output from said first frequency divider in response to the signal outputted from said fuse detection circuit.

7. The semiconductor integrated circuit according to claim 5, wherein said third selector is controlled by said logic circuit.

8. The semiconductor integrated circuit according to claim 1, wherein a plurality of second clock signals are outputted from said refresh control circuit to said plurality of semiconductor memory devices, said refresh control circuit comprising:
- a second clock generating device for outputting a fourth clock signal when said sleep control signal is at the predetermined electric potential;
- a fourth selector for receiving said first clock signal and said fourth clock signal and outputting one of said second clock signals;
- one or more delay means for delaying said second clock signal by a predetermined time; and
- one or more fifth selectors for selecting either of the output from said one or more delay means or the output from said fourth selector,
- wherein the output from said fifth selector is said second clock signal,
- said fourth selector is controlled by said sleep control signal,
- said fourth selector outputs said first clock signal as one of said second clock signals when said sleep control signal is in the first state,
- said fourth selector outputs said fourth clock signal as one of said second clock signals when said sleep control signal is in the second state,
- said fifth selector is controlled by said sleep control signal,
- said fifth selector outputs said first clock signal as said second clock signal when said sleep control signal is in the first state, and
- said fifth selector outputs the outputs from said one or more delay means as the rest of said second clock signals when said sleep control signal is in the second state.

9. The semiconductor integrated circuit according to claim 8, wherein a second frequency divider is prepared for a predetermined output among the outputs from said plurality of delay means, and the output from said second frequency divider is inputted to said fifth selector.

10. The semiconductor integrated circuit according to claim 8, wherein said fifth selector is controlled by said sleep control signal and said first refresh control signal.

11. The semiconductor integrated circuit according to claim 9, wherein said second frequency divider has a function for outputting the output from said plurality of delay means as it is without dividing the output frequency when said sleep control signal is in the first state, and said fifth selector is controlled by said first refresh control signal.

12. The semiconductor integrated circuit according to claim 1, wherein said plurality of second clock signals are outputted from said refresh control circuit to said plurality of semiconductor memory devices, said refresh control circuit comprising:

a third clock generating device for outputting a fifth clock signal when said sleep control signal is at the predetermined electric potential;

a sixth selector for receiving said first clock signal and said fifth clock signal; and a clock sequence control circuit for selectively outputting said fifth clock signal outputted from said sixth selector as said plurality of said second clock signals, wherein said clock sequence control circuit changes a selection condition for selecting said plurality of second clock signals that output said fifth clock signal in synchronization with said fifth clock signal.

13. The semiconductor integrated circuit according to claim 12, wherein the selection condition of said clock sequence control circuit is set to a predetermined condition at a rising edge of said sleep control signal.

14. The semiconductor integrated circuit according to claim 12, wherein the selection condition of said clock sequence control circuit is controlled by a signal different from said sleep control signal outputted from said logic circuit.

15. The semiconductor integrated circuit according to claim 12, wherein the selection condition of said clock sequence control circuit is set only once after a predetermined period from the start-up of a power source has elapsed.

* * * * *